(12) United States Patent
Sakiyama et al.

(10) Patent No.: US 6,914,259 B2
(45) Date of Patent: Jul. 5, 2005

(54) MULTI-CHIP MODULE, SEMICONDUCTOR CHIP, AND INTERCHIP CONNECTION TEST METHOD FOR MULTI-CHIP MODULE

(75) Inventors: Shiro Sakiyama, Kyoto (JP); Masayoshi Kinoshita, Osaka (JP); Jun Kajiwara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 49 days.

(21) Appl. No.: 10/262,669

(22) Filed: Oct. 2, 2002

(65) Prior Publication Data

US 2003/0085461 A1 May 8, 2003

(30) Foreign Application Priority Data

Oct. 3, 2001 (JP) ......................................... 2001-307579
Sep. 27, 2002 (JP) ......................................... 2002-283210

(51) Int. Cl.[7] ............................................... H01L 23/58
(52) U.S. Cl. ..................... 257/48; 257/686; 257/700; 257/777
(58) Field of Search ......................... 257/48, 686, 700, 257/707, 777; 438/11–18

(56) References Cited

U.S. PATENT DOCUMENTS 5,679,609 A    10/1997   Aimi et al.
6,180,426 B1 * 1/2001   Lin .............................. 438/15
2002/0047192 A1 * 4/2002 Inoue et al. ................. 257/686

FOREIGN PATENT DOCUMENTS

JP         58-92230        6/1983
JP         2000-258494     9/2000

* cited by examiner

*Primary Examiner*—Hoa Pham
*Assistant Examiner*—Nathan W. Ha
(74) *Attorney, Agent, or Firm*—McDermott Will & Emery LLP

(57) ABSTRACT

A multi-chip module is implemented by connecting a plurality of connection pads provided on, for example, two semiconductor chips via a plurality of conductive connecting members. To carry out a test for determining the quality of the connection between the two semiconductor chips, the multi-chip module is further provided with a plurality of switch elements so that the plurality of connecting members can be electrically conducted in a serial manner via the connection pads of the semiconductor chips. During the connection test, all the switch elements are turned on, and the impedance between both ends of the line including the plurality of connecting members conducted in a serial manner is measured using two probing pads.

14 Claims, 21 Drawing Sheets

MULTI-CHIP MODULE, SEMICONDUCTOR CHIP, AND INTERCHIP CONNECTION TEST METHOD FOR MULTI-CHIP MODULE

BACKGROUND OF THE INVENTION

The present invention relates to multi-chip modules that include a plurality of semiconductor chips having a plurality of connection pads and that are implemented by electrically connecting the associated connection pads to each other between the semiconductor chips. The present invention also relates to semiconductor chips for use in forming such multi-chip modules, and test methods for the connection between the semiconductor chips in the multi-chip modules.

In recent years, the concept of a so-called one-chip system LSI in which a plurality of functional elements are formed on a common substrate has been introduced, and various propositions have been made for methods of designing such system LSIs. In particular, the advantage of the one-chip system LSI is that a variety of functional elements such as a memory (e.g., DRAM or SRAM), a logic circuit, and an analogue circuit can be integrated on a single semiconductor chip, thus implementing a high-performance and multifunction device. However, in implementing such a device, the system LSI is confronted with two problems as described below.

A first problem is that the increase in the size of the system LSI requires considerable development efforts and the fabricating cost of the device is increased because its fabricating yield is reduced due to an increase in chip area.

A second problem is that it is hard to carry out the process of combining different types of devices (including a DRAM and a flash memory, for example) on a chip in coordination with the process of fabricating a pure CMOS, thus making it very difficult to put both the processes into practice at the same time. Therefore, the process of combining different types of devices on a chip falls behind the most advanced pure CMOS fabricating process in development for about one or two years, which prevents production and supply from timely meeting the needs of the market.

To cope with the above-described problems, Japanese Unexamined Patent Publication No. 58-92230 proposes a chip-on-chip type system LSI implemented by modularizing a plurality of semiconductor chips. In the technique of forming the chip-on-chip multi-chip module, a connection pad electrode provided on a semiconductor chip to which another semiconductor chip will be connected (hereinafter called a "master semiconductor chip"), and a connection pad electrode provided on said another semiconductor chip which is to be connected to the master semiconductor chip (hereinafter called "a slave semiconductor chip") are each formed as a bump. By connecting the connection pad electrodes between both the semiconductor chips, an electrical connection is made between the semiconductor chips, thereby modularizing a plurality of semiconductor chips.

Unlike the one-chip system LSI, the chip-on-chip type system LSI performs its functions in a distributed manner using a plurality of semiconductor chips, and thus each semiconductor chip can be reduced in size to improve its yield. Further, since even different types of devices of different process generations can be easily modularized, it is possible to expand the functions of the module. In addition, since the system LSI obtained by using the above-described technique of forming a chip-on-chip type multi-chip module has extremely shorter wiring length needed for an interface between master and slave chips compared to that provided by the other techniques of forming a multi-chip module, an interface through which high-speed signal transmission is allowed can be achieved. In this case, the interface can give the performance equivalent to that given by the interface between blocks in a conventional one-chip system LSI.

Although the above-described technique of forming a chip-on-chip type multi-chip module is a very important technique with which multi-chip modules replace conventional one-chip system LSIs, this technique has the following problems.

That is, as the technique of forming a chip-on-chip type multi-chip module is more widely used in the future, it is conceivable that a manufacturer of semiconductor chips and a manufacturer in charge of packaging and manufacturing multi-chip modules could be different. In such a case, it is impossible to determine, by using a total function test with which the quality of a whole multi-chip module is determined, whether a failure in the resulting multi-chip module is an internal failure or a connection failure caused between semiconductor chips during the packaging process. Thus, it is impossible to clarify which of the manufacturers is responsible for the failure. Therefore, it is desirable that a connection test for determining the quality of connection during a packaging process, i.e., the quality of the connection between semiconductor chips, easily at a low cost should be proposed in the near future.

An example of conventional tests for the connection between semiconductor chips is disclosed in Japanese Unexamined Patent Publication No. 2000-258494. It should be noted that in this description, the drawing (FIG. 1) of the publication is partly shown in FIGS. 7A through 7C to make it easier to understand the contents of the invention disclosed in the publication. How the test is performed will be described below with reference to FIGS. 7A through 7C.

FIG. 7A illustrates the case where a signal terminal 1-11 of an internal circuit 1-1 in a semiconductor chip 1 and a signal terminal 2-11 of an internal circuit 2-1 in a semiconductor chip 2 can be electrically connected to each other by electrically connecting a connection pad 1-21 and a connection pad 2-21 to each other, thus implementing a multi-chip module using the two semiconductor chips 1 and 2. In the publication, as shown in FIG. 7B, a connection pad 1-22 and two probing pads 1-01 and 1-02 are newly provided on the semiconductor chip 1 while a connection pad 2-22 is newly provided on the semiconductor chip 2 in order to carry out an interchip connection test on the connection between the connection pads 1-21 and 2-21. The two connection pads 2-21 and 2-22 of the semiconductor chip 2 are electrically connected to each other inside the semiconductor chip 2. When the two semiconductor chips 1 and 2 are connected by forming a chip-on-chip structure, the state of the electrical connection made between the semiconductor chips 1 and 2 are as shown in FIG. 7C. In this case, as can be seen from FIG. 7C, the two probing pads 1-01 and 1-02 are brought into conduction via the connection pads 1-22, 2-22, 2-21 and 1-21. Therefore, by measuring the impedance between both the probing pads 1-01 and 1-02, the quality of the electrical connection between the two connection pads 1-21 and 2-21 can be determined.

However, in the configuration shown in the Japanese Unexamined Patent Publication No. 2000-258494, the two connection pads 1-22 and 2-22 are needed to determine the quality of the connection at only one place, i.e., between the two connection pads 1-21 and 2-21. Furthermore, the two probing pads 1-01 and 1-02 are required to carry out a probing test. In general, probing pads are extremely larger in area than connection pads used for a chip-on-chip multi-chip module. In the configuration shown in the above publication, if the number of signals transmitted between the semiconductor chips stands at several hundreds to several thousands, the number of probing pads needs to be twice as much as that of the signals transmitted between the chips. Therefore, the technique described in the publication can no longer be applied due to the problems of the increase in the area of the probing pads and the complication of a prober itself.

SUMMARY OF THE INVENTION

It is therefore an object of the present invention to provide a configuration of a multi-chip module which allows the determination of the quality of electrical connection between semiconductor chips and a test method for the connection between the semiconductor chips by utilizing simple test circuit and test procedure that do not increase the area of the semiconductor chips.

To achieve this object, during the inventive test method for the connection between a plurality of semiconductor chips used for implementing a multi-chip module, a large number of connection pads provided on the semiconductor chips are all electrically connected in a serial manner to carry out a conduction test. Alternatively, each predetermined number of connection pads are electrically connected in a serial manner to form a plurality of connection test lines, thus carrying out a conduction test for each of the connection test lines and a non-conduction test for the connection test lines located adjacent to each other.

Therefore, the present invention provides a multi-chip module that includes a plurality of semiconductor chips each having a plurality of connection pads and that is implemented by connecting, via a plurality of conductive connecting members, the associated connection pads to each other between the semiconductor chips, wherein at least one of the plurality of semiconductor chips includes a test control circuit having conducting means for bringing into electrical conduction in a serial manner nodes of the plurality of connecting members electrically insulated from each other in the multi-chip module.

Further, in the multi-chip module, two of the plurality of semiconductor chips the associated connection pads of which are connected to each other via the connecting members may each be provided with a test control circuit, and the test control circuits may each have conducting means for bringing into electrical conduction in a serial manner nodes of the plurality of connecting members located between the two semiconductor chips and electrically insulated from each other.

Furthermore, in the multi-chip module, the number of the semiconductor chips may be two, one of the two semiconductor chips as a first semiconductor chip may have a plurality of connection pad groups each including a primary connection pad and a secondary connection pad that is electrically the same node as the primary connection pad, the other semiconductor chip as a second semiconductor chip may have a plurality of connection pads that are connected to the primary and secondary connection pads of the first semiconductor chip via a plurality of conductive connecting members, respectively, the second semiconductor chip may include the test control circuit, and the test control circuit may have conducting means for bringing into electrical conduction in a serial manner nodes of the plurality of connecting members located between the first and second semiconductor chips and electrically insulated from each other.

Moreover, in the multi-chip module, the test control circuit may include a plurality of switch elements, the plurality of switch elements may each have one end thereof connected to a node of the connecting member preselected from the plurality of connecting members, and have the other end thereof connected to a node of the other connecting member electrically insulated from the preselected connecting member, and when the plurality of switch elements are all in on state, nodes of the plurality of connecting members having been electrically insulated from each other may be electrically conducted in a serial manner.

Besides, the multi-chip module may further include connecting means for connecting a node of at least one of the plurality of connecting members not used in signal transmission between the two semiconductor chips to a power supply terminal or an earth terminal provided in the multi-chip module.

The present invention provides a semiconductor chip that includes a plurality of connection pads and is used to implement a multi-chip module by connecting, via a plurality of conductive connecting members, the associated connection pads between the semiconductor chip and another semiconductor chip, wherein the semiconductor chip is provided with a test control circuit having conducting means for bringing into electrical conduction in a serial manner nodes of the plurality of connecting members electrically insulated from each other in the multi-chip module that has been implemented.

The present invention provides an interchip connection test method for a multi-chip module that includes a plurality of semiconductor chips each having a plurality of connection pads and that is implemented by connecting, via a plurality of conductive connecting members, the associated connection pads to each other between the semiconductor chips. The method includes the steps of: during the interchip connection test, bringing into electrical conduction in a serial manner nodes of the plurality of connecting members electrically insulated from each other in the multi-chip module; and measuring the impedance between both ends of a circuit including the connecting members that have been electrically conducted in a serial manner, thus determining the quality of the connection between the semiconductor chips.

The present invention provides another multi-chip module that includes a plurality of semiconductor chips each having a plurality of connection pads and that is implemented by connecting, via a plurality of conductive connecting members, the associated connection pads between the semiconductor chips, wherein the multi-chip module further includes a test control circuit having conducting means for forming a plurality of connection test lines by bringing into electrical conduction in a serial manner at least every two nodes of the plurality of connecting members electrically insulated from each other.

Further, in the multi-chip module, the test control circuit may have the function of changing the combination of nodes of at least two of the connecting members to change the connection test lines to be formed.

Furthermore, in the multi-chip module, the plurality of connection pads on the semiconductor chips may be provided to form a lattice-like configuration, and the test control circuit may change the combination of nodes of the connecting members to form a plurality of vertical connection test lines or a plurality of horizontal connection test lines.

The present invention provides another interchip connection test method for the multi-chip module. The method includes the steps of: during the interchip connection test, forming a plurality of connection test lines using the conducting means; carrying out a conduction test for each of the connection test lines; and carrying out a non-conduction test for the connection test lines located adjacent to each other, thus determining the quality of the connection between the semiconductor chips.

Further, in the interchip connection test method, if the connection between the semiconductor chips is determined to be defective by carrying out the conduction test for each of the connection test lines and the non-conduction test for the connection test lines located adjacent to each other, the step of connecting, via conductive connecting members, the associated connection pads to each other between the same semiconductor chips may be carried out again.

The present invention provides still another a multi-chip module that includes a plurality of semiconductor chips each having a plurality of connection pads and that is implemented by connecting, via a plurality of conductive connecting members, the associated connection pads to each other between the semiconductor chips, wherein the multi-chip module further includes: first and second switch circuits that are located between predetermined two of the connecting members and are connected to each other in series; and a third switch circuit located between a node at which the first and second switch circuits are connected and the ground.

The present invention provides still another interchip connection test for the multi-chip module. The method includes the steps of: during the interchip connection test, turning the first and second switch circuits on and turning the third switch circuit off, and during the normal operation of the module, turning the first and second switch circuits off and turning the third switch circuit on.

Thus, in the inventive multi-chip module having the plurality of semiconductor chips, the plurality of connecting members whose connection quality needs to be determined are electrically conducted in a serial manner by the conducting means during the test for the connection between the semiconductor chips. Accordingly, by only measuring the impedance between both ends of the line including the plurality of connecting members electrically conducted in a serial manner, the quality of the connection between the semiconductor chips can be determined.

Since the connection test method of the present invention is a very simple one in which the quality of the connection can be determined by only measuring the impedance between both ends of the line including the plurality of connecting members conducted in a serial manner, it is possible to considerably reduce the time and cost of the test for the connection between the semiconductor chips. Furthermore, even if the number of connecting members is large, the increase in the area of the semiconductor chips is extremely small because, as the probing pads required for the impedance measurement, two electrodes need only be provided at both ends of the line including the connecting members conducted in a serial manner.

In particular, only the second semiconductor chip has the test control circuit in the present invention. Therefore, a modification is only made to wiring when the present invention is applied to the first semiconductor chip that forms a part of the multi-chip module. Thus, the first semiconductor chip can be developed in a short period of time. If the first semiconductor chip includes a memory, for example, transistors used for the memory are densely provided on the first semiconductor chip, and thus the conducting means might not be provided at an optimum position in the first semiconductor chip. However, even in such a case, the present invention will have a considerable effect since the first semiconductor chip does not have to include the conducting means and a modification is only made to wiring. Furthermore, if the first semiconductor chip is a substrate chip in which only wiring is provided, i.e., a chip provided with no elements such as transistors, the elements for use in forming the conducting means cannot be provided in the first semiconductor chip, but the connection test of the present invention can be carried out.

In addition, in the present invention, if the conducting means includes a switch element (e.g., a MOS switch) provided between nodes of the connecting members that are digital and analogue signal lines, crosstalk between the digital and analogue signal lines may occur due to a parasitic capacitance generated between the gate and source of the switch element which is in off state during the normal operation of the module. This might cause an electrical change in a digital signal to adversely affect the analogue signal line that is a high-impedance node. In the present invention, a node of the connecting member on one of the lines located between digital and analogue signal lines and not used in signal transmission between the semiconductor chips, however, is connected to a power supply terminal or an earth terminal to become a low-impedance node. As a result, the problem of crosstalk can be avoided.

Further, in the present invention, each predetermined number of connecting members can be electrically conducted in a serial manner to form a connection test line. Thus, the quality of the connection between the semiconductor chips can be determined by carrying out a conduction test for each of the connection test lines. Furthermore, by carrying out a non-conduction test for the connection test lines located adjacent to each other, it is possible to check for a short failure occurred between the connecting members belonging to two of the connection test lines.

In particular, the plurality of connection test lines to be formed can be arbitrarily changed in the present invention. Therefore, by forming a plurality of vertical connection test lines and a plurality of horizontal connection test lines, for example, it is possible to determine whether a short failure occurs between each connecting member and the connecting member adjacent thereto.

Moreover, in the present invention, if the interchip connection has been determined to be defective in the interchip connection test method, the step of connecting, via conductive connecting members, the associated connection pads to each other between the same semiconductor chips is carried out again. Thus, the determination of the quality of the interchip connection is repeated to make all the manufactured multi-chip modules non-defective.

In addition, in the present invention, a node of the connecting member on the line located between analog and digital signal lines, for example, is grounded by turning the third switch circuit on, and thus the node becomes a low-impedance node. Accordingly, the problem of crosstalk can be avoided. Besides, since a connecting member connected to a line that is not used in signal transmission between the semiconductor chips does not have to be provided, the effect of reducing the chip area is attained outstandingly if the area of the semiconductor chips is determined by the total size of the connection pads.

DESCRIPTION OF THE PREFERRED EMBODIMENTS

Hereinafter, preferred embodiments of the present invention will be described with reference to the accompanying drawings.

(First Embodiment)

Figure 1:
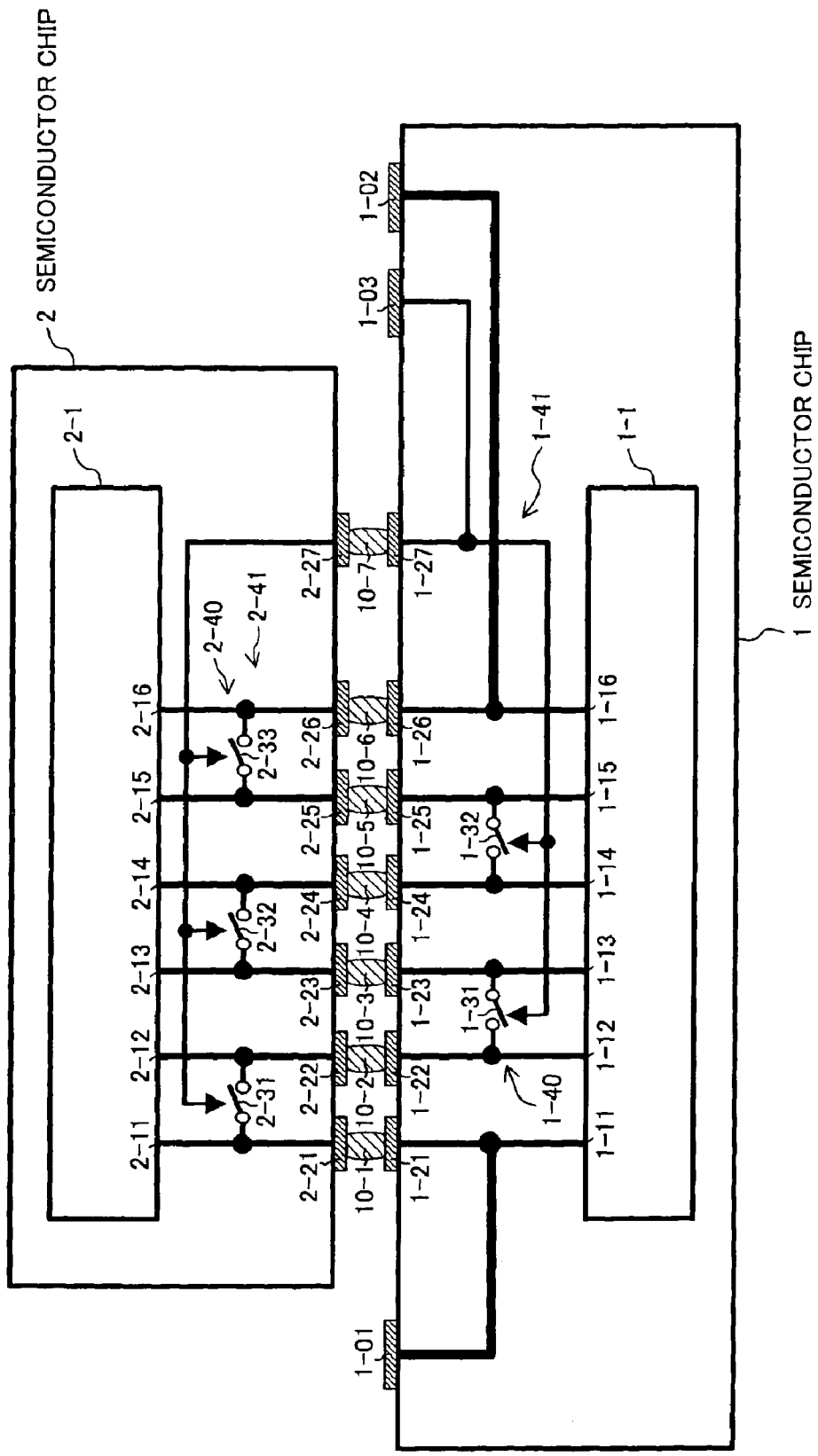
FIG. 1 is a diagram showing a circuit configuration of a chip-on-chip type multi-chip module according to a first embodiment of the present invention, in which switch elements are provided in both master and slave semiconductor chips.

FIG. 1 shows the overall configuration of a chip-on-chip (hereinafter, abbreviated as COC) type multi-chip module according to a first embodiment of the present invention. That is, FIG. 1 shows an exemplary circuit configuration of a multi-chip module to which the present invention is applied, wherein the multi-chip module includes a semiconductor chip 1 having an internal circuit 1-1 and a semiconductor chip 2 having an internal circuit 2-1, the internal circuits 1-1 and 2-1 are provided with signal terminals 1-11 through 1-16 and signal terminals 2-11 through 2-16, respectively, and the signal terminals 1-11 through 1-16 are connected to the signal terminals 2-11 through 2-16, respectively, thus implementing the multi-chip module.

In FIG. 1, the signal terminal 1-11 is electrically connected to the connection pad 1-21 provided on the semiconductor chip 1, and the signal terminal 2-11 is electrically connected to the connection pad 2-21 provided on the semiconductor chip 2. By electrically connecting these two connection pads 1-21 and 2-21 via a connecting member 10-1, an electrical connection can be made between the signal terminal 1-11 and the signal terminal 2-11. Similarly, the other corresponding signal terminals of the two semiconductor chips 1 and 2, i.e., the signal terminals 1-12 and 2-12, 1-13 and 2-13, 1-14 and 2-14, 1-15 and 2-15, and 1-16 and 2-16, are electrically connected via connection pads 1-22, 1-23, 1-24, 1-25 and 1-26 provided on the semiconductor chip 1, connecting members 10-2, 10-3, 10-4, 10-5 and 10-6, and connection pads 2-22, 2-23, 2-24, 2-25 and 2-26 provided on the semiconductor chip 2, respectively.

In the present embodiment, the multi-chip module implemented in this manner is further provided with the following test components. That is, the semiconductor chip (slave chip) 2 is provided with a test control circuit 2-41 including a conducting means 2-40. The conducting means 2-40 includes: a switch element 2-31 provided between the two connection pads 2-21 and 2-22 electrically insulated from each other; a switch element 2-32 similarly provided between the two connection pads 2-23 and 2-24 electrically insulated from each other; and a switch element 2-33 provided between the other two connection pads 2-25 and 2-26 electrically insulated from each other.

On the other hand, the semiconductor chip (master chip) 1 is provided with a conducting means 1-40 including: a switch element 1-31 provided between the two connection pads 1-22 and 1-23 electrically insulated from each other; and a switch element 1-32 provided between the two connection pads 1-24 and 1-25 electrically insulated from each other. Furthermore, the semiconductor chip 1 is further provided with: a probing pad 1-03 through which an electrical signal is supplied to the five switch elements to control the on/off states of the five switch elements 2-31, 1-31, 2-32, 1-32 and 2-33 provided in the master and slave semiconductor chips 1 and 2; a probing pad 1-01 that is located at the left end of the semiconductor chip 1 in FIG. 1 and is connected to the connection pad 1-21; and a probing pad 1-02 that is located at the right end of the semiconductor chip 1 in FIG. 1 and is connected to the connection pad 1-26. The conducting means 1-40 and the probing pads 1-01 through 1-03 form a test control circuit 1-41 for the master semiconductor chip 1.

It should be noted that in FIG. 1, the reference characters 1-27 and 2-27 denote connection pads provided on the master and slave semiconductor chips 1 and 2, respectively, and the reference character 10-7 denotes a connecting member through which both the pads 1-27 and 2-27 are connected and an electrical signal from the probing pad 1-03 of the master semiconductor chip 1 is supplied to the three switch elements 2-31, 2-32 and 2-33 of the slave semiconductor chip 2.

Next, the operation of the multi-chip module according to the present embodiment will be described. In the normal operation of the multi-chip module, the five switch elements 1-31, 1-32, and 2-31 through 2-33 are controlled to turn off in response to an electrical signal from the probing pad 1-03. In this case, since six signal lines through which the internal circuits 1-1 and 2-1 are connected are electrically insulated from each other in the two semiconductor chips 1 and 2, an interface can be provided in a usual manner between the corresponding signal terminals 1-11 and 2-11, 1-12 and 2-12, 1-13 and 2-13, 1-14 and 2-14, 1-15 and 2-15, and 1-16 and 2-16.

An interchip connection test for determining the quality of the electrical connection between the corresponding connection pads (1-21 and 2-21, 1-22 and 2-22, 1-23 and 2-33, 1-24 and 2-24, 1-15 and 2-25, and 1-26 and 2-26) on the two semiconductor chips 1 and 2 is carried out as follows. First, each power supply line for the semiconductor chips 1 and 2 is allowed to be in a floating state to put the output of each of the signal terminals 1-11 through 1-16 and the signal terminals 2-11 through 2-16 in a high impedance state. Next, the five switch elements 1-31, 1-32, and 2-31 through 2-33 are controlled to turn on in response to an electrical signal from the probing pad 1-03. Thus, the line between the two probing pads 1-01 and 1-02 can be electrically conducted in a serial manner through the connecting members 10-1 through 10-6 and the switch elements 2-31, 1-31, 2-32, 1-32 and 2-33. Accordingly, by measuring the impedance between the two probing pads 1-01 and 1-02, the quality of the connection made by each of the connecting members 10-1 through 10-6 can be determined.

As described above, the connecting members for making the connection between the semiconductor chips 1 and 2, the quality of which needs to be determined, are electrically conducted in a serial manner. Therefore, the quality of the connection between the semiconductor chips 1 and 2 can be determined by measuring the impedance between both ends of the test control circuit 1-41 electrically conducted in a serial manner. Even if the number of the connecting members is large, the number of the probing pads required for the measurement is extremely small. This is because the number of the probing pads required is just three in total, that is, two probing pads (the probing pads 1-01 and 1-02) at both the ends of the conducted circuit 1-41 and one probing pad (the probing pad 1-03) for turning the switch elements on/off. Further, since the quality of the connection can be determined by carrying out a simple test method for measuring the impedance between the probing pads 1-01 and 1-02, the time and cost of the test for the connection between the semiconductor chips 1 and 2 is considerably reduced. Furthermore, in general, the number of elements integrated on a semiconductor chip stands at several millions to several tens of millions, whereas the number of switch elements newly provided in this invention is on the order of several tens to several thousands. Consequently, in this invention, an increase in the area of each semiconductor chip caused by providing a test circuit including switch elements, for example, can be substantially ignored.

(Second Embodiment)

Figure 2:
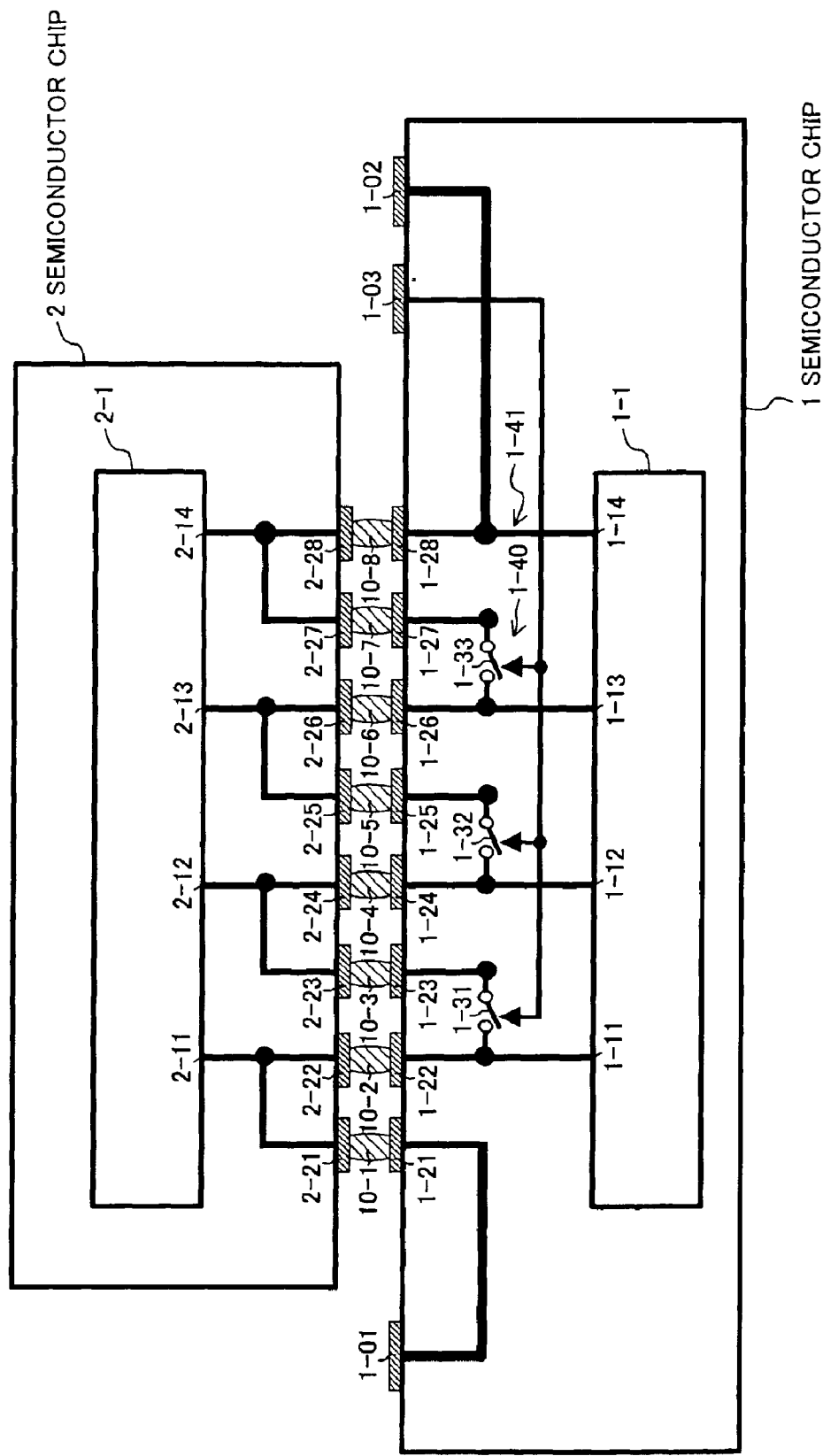
FIG. 2 is a diagram showing a circuit configuration of a chip-on-chip type multi-chip module according to a second embodiment of the present invention, in which switch elements are provided only in a master semiconductor chip.

FIG. 2 shows a multi-chip module according to a second embodiment of the present invention. Although the test control circuits 1-41 and 2-41 can be provided in the master and slave semiconductor chips 1 and 2, respectively, in the first embodiment, the test control circuit is provided only in a semiconductor chip 1 in the present embodiment. It should be noted that in FIG. 2, the same components are identified by the same reference characters as those used in FIG. 1.

FIG. 2 shows an exemplary circuit configuration of a multi-chip module which is implemented by connecting signal terminals 1-11 through 1-14 of an internal circuit 1-1 in the semiconductor chip 1 to signal terminals 2-11 through 2-14 of an internal circuit 2-1 in a semiconductor chip 2.

The feature of the present embodiment is that the slave chip (first semiconductor chip) 2 is provided with no test control circuit 2-41 unlike the first embodiment, but the signal terminals 2-11 through 2-14 each have two connection pads which are electrically identical nodes. For example, the signal terminal 2-11 has two connection pads 2-21 and 2-22 as electrically identical nodes. Similarly, the signal terminal 2-12 has two connection pads 2-23 and 2-24, the signal terminal 2-13 has two connection pads 2-25 and 2-26, and the signal terminal 2-14 has two connection pads 2-27 and 2-28.

On the other hand, the master chip (second semiconductor chip) 1 has connection pads 1-21 through 1-28 that correspond to the connection pads 2-21 through 2-28 on the semiconductor chip 2, respectively. The connection pads 1-21 through 1-28 are connected to the connection pads 2-21 through 2-28 on the semiconductor chip 2 via connecting members 10-1 through 10-8, respectively. The signal terminals 1-11 through 1-14 in the semiconductor chip 1 are connected to the connection pads 1-22, 1-24, 1-26 and 1-28, respectively.

Like the first embodiment, the semiconductor chip 1 is further provided with a conducting means 1-40. The conducting means 1-40 includes: a switch element 1-31 provided between the two connection pads 1-22 and 1-23 electrically insulated from each other; a switch element 1-32 provided between the two connection pads 1-24 and 1-25 electrically insulated from each other; and a switch element 1-33 provided between the other two connection pads 1-26 and 1-27 electrically insulated from each other. The on/off control of the three switch elements 1-31 through 1-33 is allowed by an electrical signal supplied from a probing pad 1-03. The conducting means 1-40 and three probing pads 1-01, 1-02 and 1-03 as described in the first embodiment form a test control circuit 1-41.

The multi-chip module of the present embodiment operates in the same way as that of the first embodiment. Specifically, in the normal operation of the multi-chip module, the switch elements 1-31 through 1-33 are controlled to turn off in response to an electrical signal from the probing pad 1-03. Since four signal lines through which the internal circuits 1-1 and 2-1 are connected are thus electrically insulated from each other in the two semiconductor chips 1 and 2, an interface can be provided in a usual manner between the corresponding signal terminals 1-11 and 2-11, 1-12 and 2-12, 1-13 and 2-13, and 1-14 and 2-14.

Furthermore, a test for the connection between semiconductor chips for determining the quality of the electrical connection between the corresponding connection pads (1-22 and 2-22, 1-24 and 2-24, 1-26 and 2-26, and 1-28 and 2-28) on the semiconductor chips 1 and 2 is carried out as follows. First, each power supply line for the semiconductor chips 1 and 2 is allowed to be in a floating state to put the output of each of the signal terminals 1-11 through 1-14 and the signal terminals 2-11 through 2-14 in a high impedance state. Next, the three switch elements 1-31 through 1-33 are controlled to turn on in response to an electrical signal from the probing pad 1-03. Thus, the line between the two probing pads 1-01 and 1-02 can be electrically conducted in a serial manner via the connecting members 10-1 through 10-8 and the three switch elements 1-31 through 1-33. Accordingly, by measuring the impedance between the two probing pads 1-01 and 1-02, the quality of the connection made by each of the connecting members 10-2, 10-4, 10-6 and 10-8 can be determined.

Since the conducting means 1-40 for allowing the serial electrical conduction is provided only in the semiconductor chip 1 in this manner, in addition to the effect of the first embodiment, the following three more effects can be achieved in the present embodiment. First, if the present embodiment is applied to the semiconductor chip 2, only its wiring is modified; therefore, the development of the semiconductor chip 2 is enabled in a short period of time. Secondly, if the semiconductor chip 2 is one on which transistors for memory, for example, are densely provided, switch elements might not be provided at optimum positions. Even in such a case, according to the present embodiment, it is possible to easily apply the present invention to the high-density semiconductor chip 2 by only making a modification to its wiring. Thirdly, even if the semiconductor chip 2 is a substrate chip provided with only wiring, i.e., a chip that cannot be provided with elements such as switch elements, the connection test of the present invention can be carried out for this semiconductor chip.

(Third Embodiment)

Figure 3:
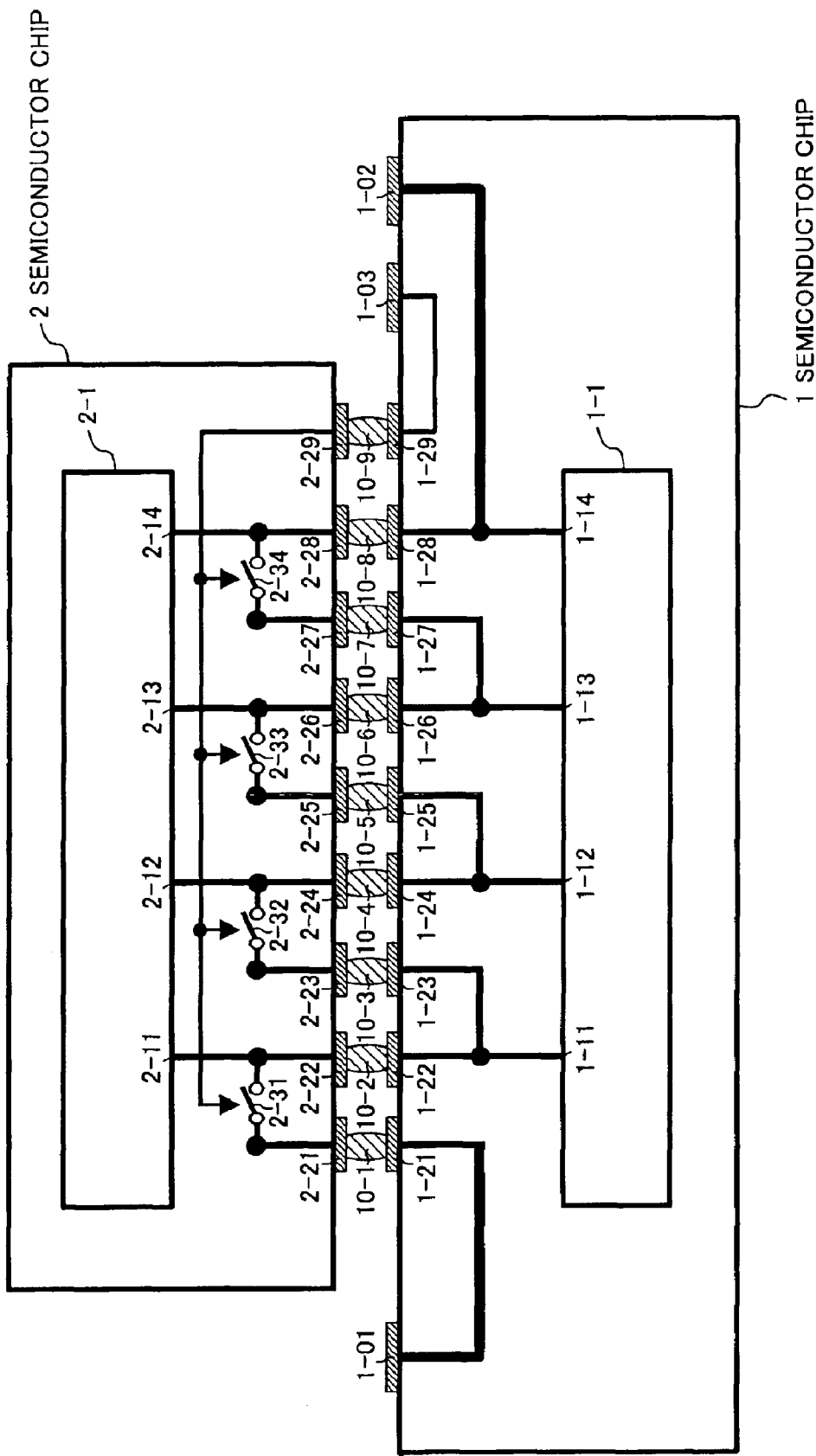
FIG. 3 is a diagram showing a circuit configuration of a chip-on-chip type multi-chip module according to a third embodiment of the present invention, in which switch elements are provided only in a slave semiconductor chip.

FIG. 3 shows a multi-chip module according to a third embodiment of the present invention. In the second embodiment, only the semiconductor chip 1 is provided with the test control circuit, that is, the switch elements are inserted into only the semiconductor chip 1. To the contrary, in the third embodiment, only the semiconductor chip 2 is provided with switch elements. Other than this point, the operating principle and effects of the multi-chip module are exactly the same as those of the second embodiment. Accordingly, those skilled in the art can easily understand the operating principle, and therefore the detailed description thereof will be omitted.

(Fourth Embodiment)

Figure 4:
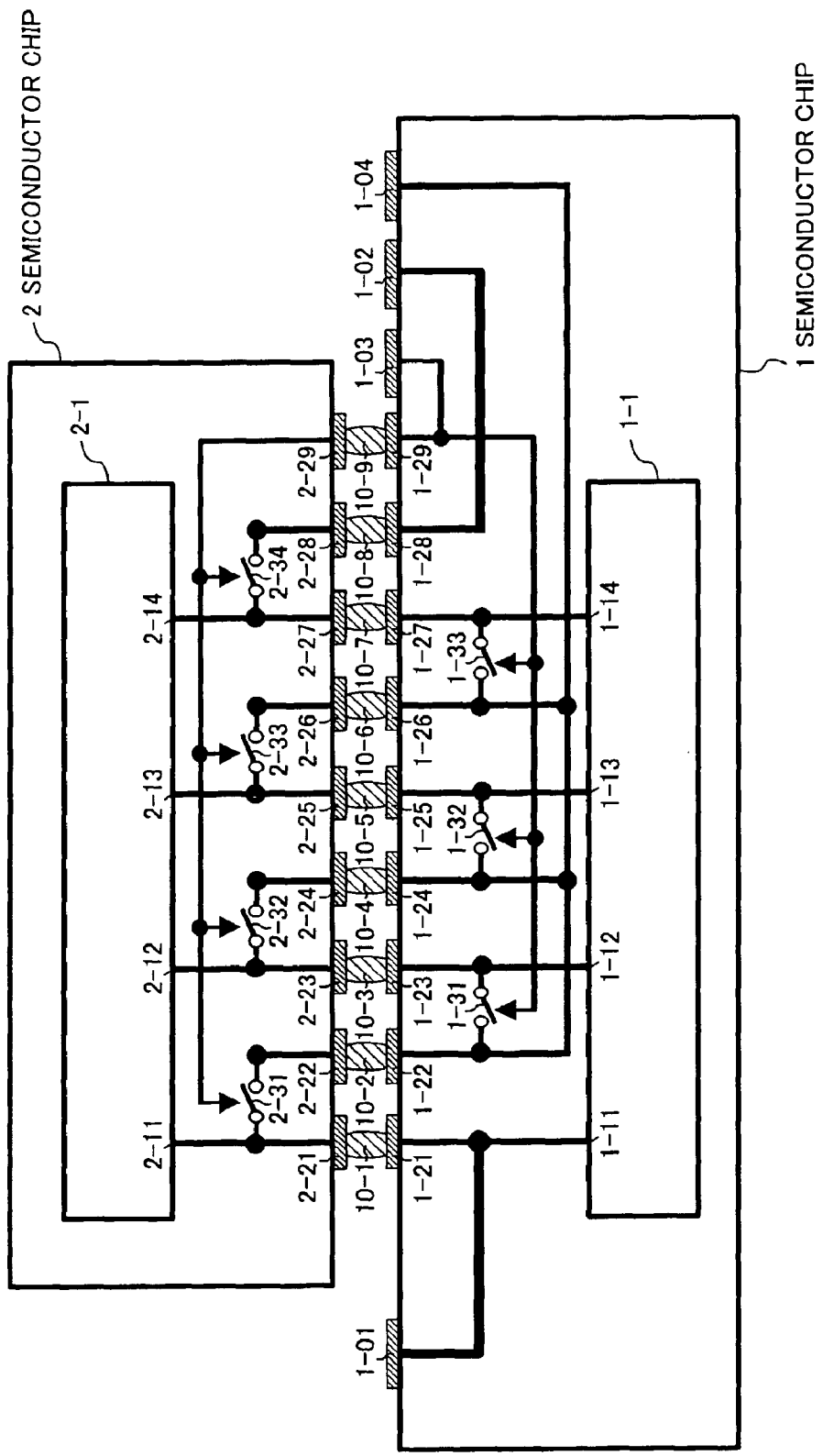
FIG. 4 is a diagram showing a circuit configuration of a chip-on-chip type multi-chip module according to a fourth embodiment of the present invention, in which crosstalk between signal lines caused by switch elements is suppressed.

FIG. 4 shows a multi-chip module according to a fourth embodiment of the present invention. Although the operating principle and effects of the multi-chip module according to the present invention have been described in the foregoing first through third embodiments, problems and solutions thereto regarding the application of the present invention will be described below with reference to FIGS. 4 and 5.

In the present invention, if a MOS switch is used as a newly provided switch element, a parasitic capacitance generated between the gate and source of the switch element in off state might cause the problem of crosstalk between the signal lines in semiconductor chips. How this crosstalk occurs will be briefly described with reference to FIG. 5.

Figure 5:
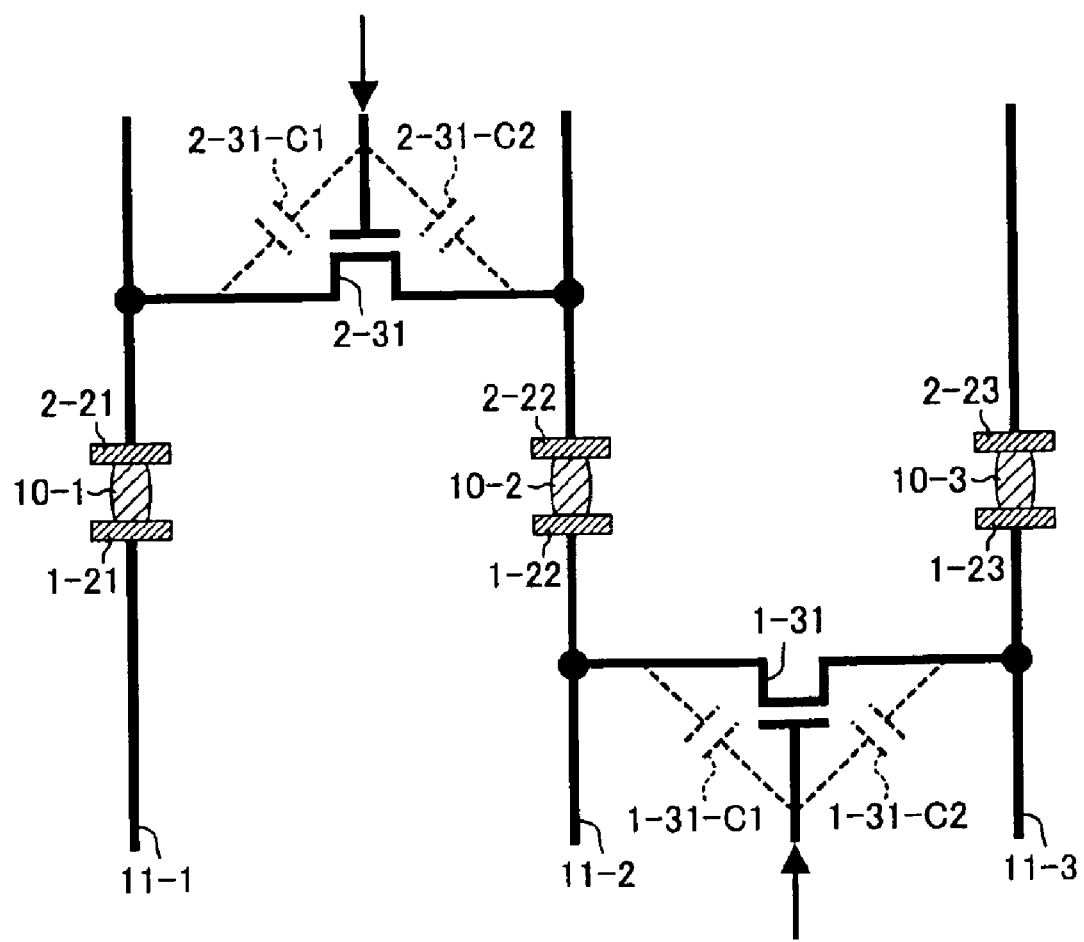
FIG. 5 is a diagram showing how the crosstalk between signal lines is caused by the switch elements.

In FIG. 5, the reference characters 2-31 and 1-31 each denote a MOS switch. In general, a parasitic capacitance exists between the gate and source (in FIG. 5, parasitic capacitances 2-31-C1 and 2-31-C2 are generated between the gate and source of the switch element 2-31, and parasitic capacitances 1-31-C1 and 1-31-C2 are generated between the gate and source of the switch element 1-31). If an electrical change has occurred in the signal line 11-1 in the semiconductor chips, electric power is transmitted due to the parasitic capacitances, thus causing crosstalk noise to the interchip signal line 11-2. This causes no particular problem if the interchip signal lines are digital signal lines. To the contrary, if the interchip signal lines include both a digital signal line and an analogue signal line, the crosstalk might adversely affect, due to an electrical change in a digital signal, the analogue signal line that is a high-impedance node. However, if the interchip signal line 11-2 is a low-impedance node that causes no electrical change, the electrical change in the interchip signal line 11-1 will not have an adverse effect of the crosstalk noise on the interchip signal line 11-3.

The present embodiment applies the above principle to the multi-chip module and its object is to suppress the crosstalk noise between interchip signal lines by providing a dummy power supply node or ground node between one interchip signal line and the other interchip signal line.

In FIG. 4, the same components of the multi-chip module of the present embodiment as the counterparts used in the first embodiment are identified by the same reference characters as those used in FIG. 1. The feature of the fourth embodiment shown in FIG. 4 different from that of the first embodiment shown in FIG. 1 is that each line in semiconductor chips 1 and 2 not used in signal transmission between the semiconductor chips 1 and 2 is a low-impedance node that will cause no electrical change. More specifically, connecting members 10-2, 10-4 and 10-6 that are provided between the semiconductor chips 1 and 2 and are not used in the signal transmission therebetween are connected to a probing pad 1-04 provided on the semiconductor chip 1. When the multi-chip module is in a normal operation, the probing pad (connecting means) 1-04 is connected to a power supply terminal or earth terminal provided in the multi-chip module, and the impedance of the probing pad 1-04 is stabilized at a low level.

During the normal operation of the multi-chip module according to the present embodiment, the switch elements 1-31 through 1-33 and switch elements 2-31 through 2-34 are controlled to turn off in response to an electrical signal from a probing pad 1-03, and the impedance of the probing pad 1-04 is stabilized at a low level. Thus, since four signal lines through which internal circuits 1-1 and 2-1 in the two semiconductor chips 1 and 2 are connected are electrically insulated from each other, an interface can be provided in a usual manner between the corresponding signal terminals (1-11 and 2-11, 1-12 and 2-12, 1-13 and 2-13, and 1-14 and 2-14) of the two semiconductor chips 1 and 2. Further, the potential at one end of each of the switch elements 1-31 through 1-33 and switch elements 2-31 through 2-33 is stabilized by the probing pad 1-04, thus preventing the adverse effects of the crosstalk noise between the signal lines, each provided between the corresponding signal terminals (1-11 and 2-11, 1-12 and 2-12, 1-13 and 2-13, and 1-14 and 2-24).

Furthermore, an interchip connection test for determining the quality of the electrical connection between the corresponding connection pads (1-21 and 2-21, 1-23 and 2-23, 1-25 and 2-25, and 1-27 and 2-27) of the semiconductor chips 1 and 2 is carried out as follows. First, each power supply line for the semiconductor chips 1 and 2 is allowed to be in a floating state to put the output of each of the signal terminals 1-11 through 1-14 and signal terminals 2-11 through 2-14 in a high impedance state. Next, the seven switch elements 1-31 through 1-33, and 2-31 through 2-34 are controlled to turn on in response to an electrical signal from the probing pad 1-03, and the probing pad 1-04 is put into a floating node. Thus, in the same way as described in the first embodiment, the line between two probing pads 1-01 and 1-02 can be electrically conducted in a serial manner. Accordingly, by measuring the impedance between the two probing pads 1-01 and 1-02, the quality of the connection made by each of the connecting members 10-1, 10-3, 10-5 and 10-7 can be determined.

The present embodiment is particularly advantageous when both a digital signal line and an analogue signal line are provided. If the adverse effects of the cross-coupling noise between the digital and analogue signal lines need to be prevented during the normal operation of the multi-chip module, the adverse effects of the cross-coupling noise can be prevented by allowing the line located between the digital and analogue signal lines to serve as a low-impedance node that will cause no electrical change. The signal lines located at the right and left of each of the four interchip connecting members 10-2, 10-4, 10-6 and 10-8 that are not used in signal transmission may be a combination of a digital signal line and an analogue signal line. For example, the signal line between the signal terminals 1-12 and 2-12 is an analogue signal line and the other signal lines are digital signal lines. In this case, only the interchip connecting members 10-2 and 10-4 are allowed to be low-impedance nodes.

(Fifth Embodiment)

Figure 6:
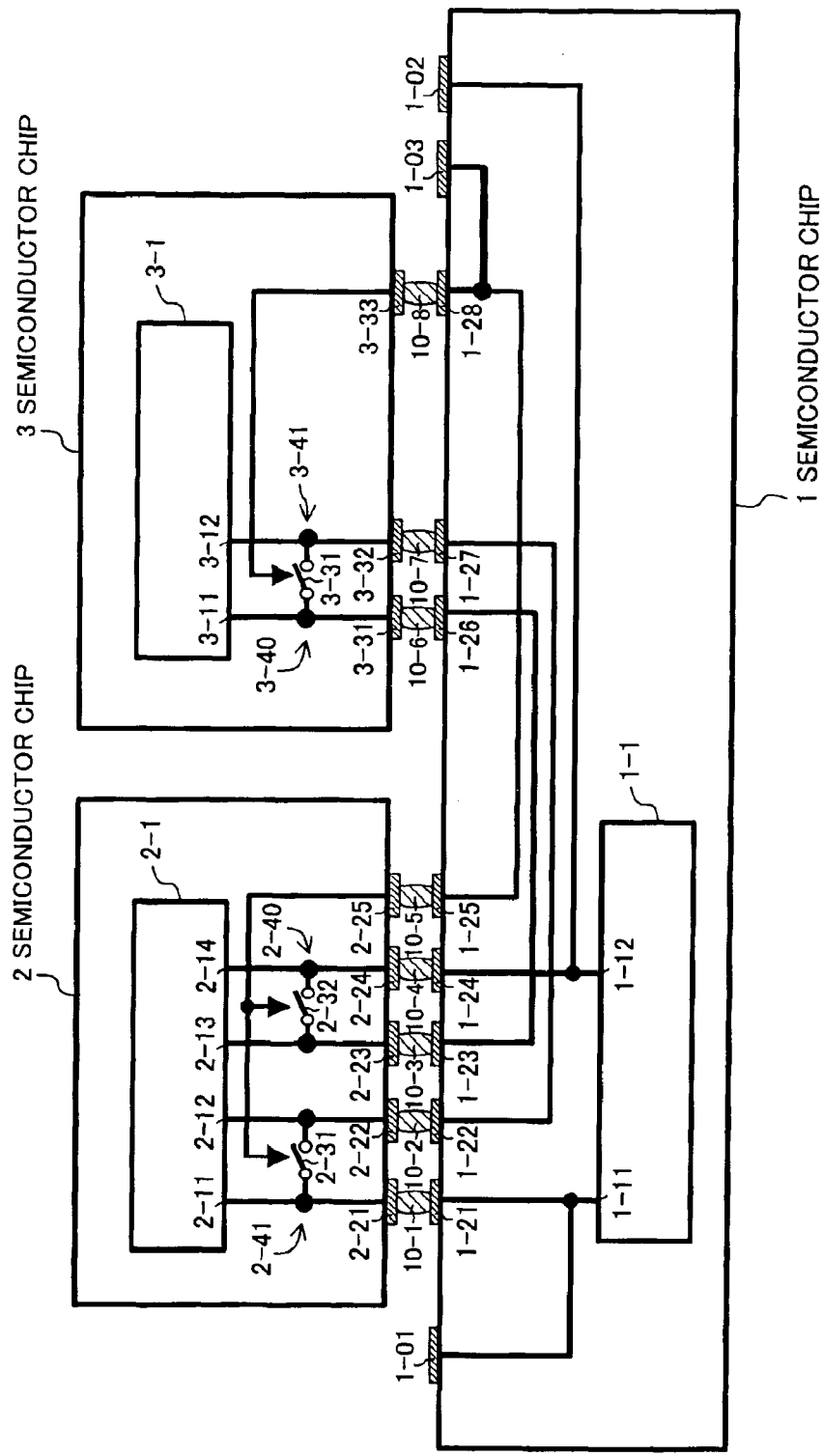
FIG. 6 is a diagram showing a circuit configuration of a chip-on-chip type multi-chip module according to a fifth embodiment of the present invention in which the multi-chip module is implemented by using a plurality of semiconductor chips.
Figure 7A:
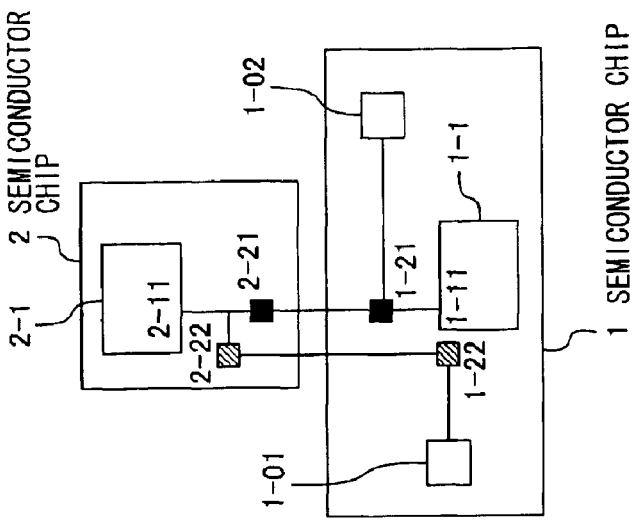
FIGS. 7A through 7C are diagrams each showing a circuit configuration of a chip-on-chip type multi-chip module including a conventional interchip connection test means.
Figure 7B:
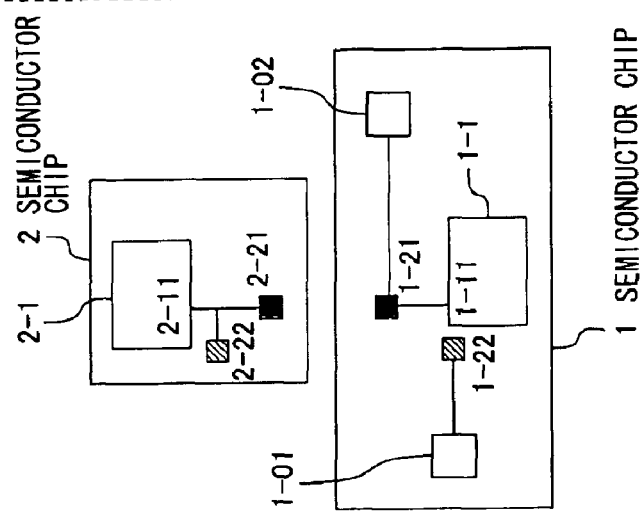
Figure 7C:
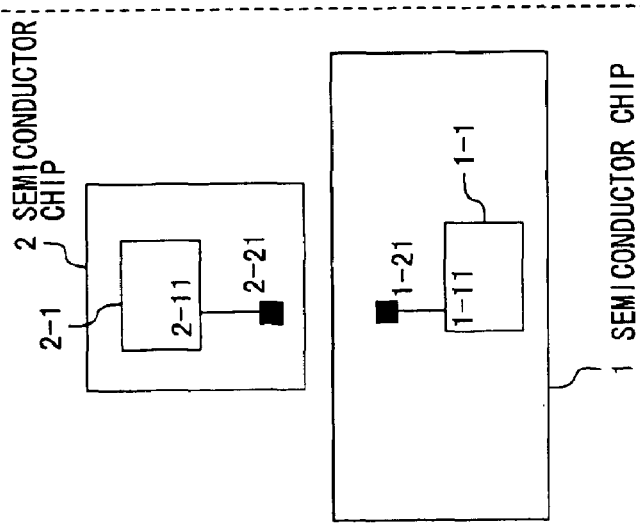

FIG. 6 shows a multi-chip module according to a fifth embodiment of the present invention. In the present embodiment, the present invention is applied to determine the quality of the connection between three or more semiconductor chips. It should be noted that in FIG. 6, three semiconductor chips are used to implement the multi-chip module.

As shown in FIG. 6, the multi-chip module includes semiconductor chips 1, 2 and 3 that have internal circuits 1-1, 2-1 and 3-1, respectively. The internal circuit 1-1 has signal terminals 1-11 and 1-12, the internal circuit 2-1 has signal terminals 2-11 through 2-14, and the internal circuit 3-1 has signal terminals 3-11 and 3-12. The signal terminals 1-11 is electrically connected to the signal terminal 2-11 via connection pads 1-21 and 2-21 and a connecting member 10-1, and the signal terminal 1-12 is electrically connected to the signal terminal 2-14 via connection pads 1-24 and 2-24 and a connecting member 10-4. And through the semiconductor chip 1, the signal terminal 2-12 is electrically connected to the signal terminal 3-12 via connection pads 2-22, 1-22, 1-27 and 3-32 and connecting members 10-2 and 10-7, and the signal terminal 2-13 is electrically connected to the signal terminal 3-11 via connection pads 2-23, 1-23, 1-26 and 3-31 and connecting members 10-3 and 10-6.

Further, the semiconductor chip 2 is provided with a test control circuit 2-41 including a conducting means 2-40. The conducting means 2-40 has: a switch element 2-31 for making a connection between the two connection pads 2-21 and 2-22 electrically insulated from each other; and a switch element 2-32 for making a connection between the other two connection pads 2-23 and 2-24 electrically insulated from each other. Similarly, the semiconductor chip 3 is provided with a test control circuit 3-41 including a conducting means 3-40. The conducting means 3-40 has a switch element 3-31 for making a connection between the two connection pads 3-31 and 3-22 electrically insulated from each other. The semiconductor chip 1 is further provided with: two probing pads 1-01 and 1-02 for the impedance measurement as described above; and a probing pad 1-03 for turning the switch elements on/off. Through this probing pad 1-03, an electrical signal is supplied to the switch elements 2-31 and 2-32 via the connection pads 1-25 and 2-25 and the connecting member 10-5, and supplied to the switch element 3-31 via the connection pads 1-28 and 3-33 and the connecting member 10-8. It is to be noted that the semiconductor chip 1 is provided with no switch element.

The multi-chip module of the present embodiment operates in the same manner as that of the first embodiment. Specifically, in the normal operation of the multi-chip module, the switch elements 2-31, 2-32 and 3-31 are controlled to turn off in response to an electrical signal from the probing pad 1-03. Since the signal lines of the three semiconductor chips 1 through 3 are thus electrically insulated from each other, an interface can be provided in a usual manner between the corresponding signal terminals 2-11 and 1-11, signal terminals 2-12 and 3-12, signal terminals 2-13 and 3-11, and signal terminals 2-14 and 1-12.

An interchip connection test for determining the quality of the electrical connection between the corresponding connection pads (1-21 and 2-21, 1-22 and 2-22, 1-23 and 2-23, 1-24 and 2-24, 1-26 and 3-31, and 1-27 and 3-32) of the three semiconductor chips 1, 2 and 3 is carried out as follows. First, each power supply line for the semiconductor chips 1, 2 and 3 is allowed to be in a floating state to put the output of each of the signal terminals in a high impedance state. Next, the three switch elements 2-31, 2-32 and 3-31 are controlled to turn on in response to an electrical signal from the probing pad 1-03. Thus, the line between the two probing pads 1-01 and 1-02 can be electrically conducted in a serial manner via the connecting members 10-1 through 10-7 and the switch elements 2-31, 2-32 and 3-31. Accordingly, by measuring the impedance between the two probing pads 1-01 and 1-02, the quality of the connection made by each of the connecting members 10-1 through 10-7 can be determined.

As described above, the connection test of the present embodiment can be carried out for a multi-chip module having three or more semiconductor chips in the same manner as that carried out for a multi-chip module having two semiconductor chips by providing a conducting means for conducting all connecting members to be subjected to the connection test in a serial manner.

It should be noted that although the multi-chip module of the present embodiment includes three semiconductor chips, the multi-chip module may naturally include three or more semiconductor chips, and the configuration in which only one of semiconductor chips is allowed to have a test control circuit as described in the second embodiment may be adopted. Also, the configuration that can avoid crosstalk noise between signal lines as described in the fourth embodiment may be applied to the multi-chip module of the present embodiment including three or more semiconductor chips.

(Sixth Embodiment)

FIG. 8 schematically shows the overall configuration of a COC type multi-chip module according to a sixth embodiment of the present invention. In the present embodiment, in addition to determining the quality of the connection between semiconductor chips, it is possible to test the multi-chip module for a short failure between connecting members.

Figure 8A:
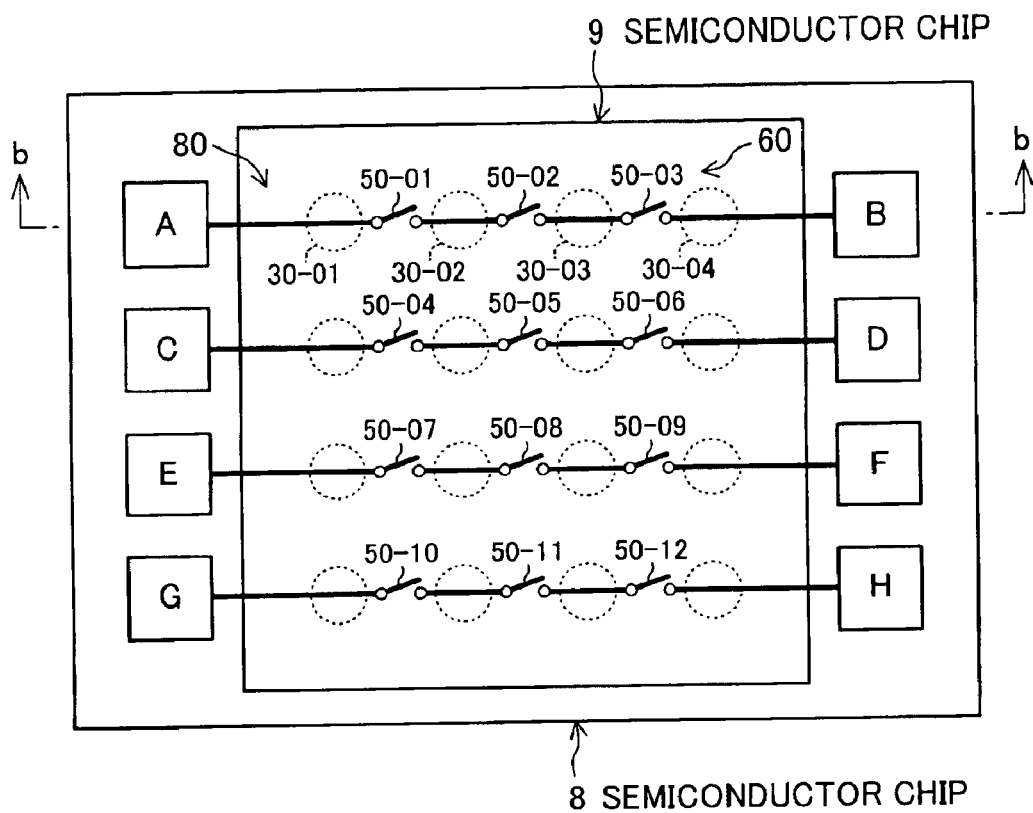
FIG. 8A is a schematic top view of a chip-on-chip type multi-chip module according to a sixth embodiment of the present invention.
Figure 8B:
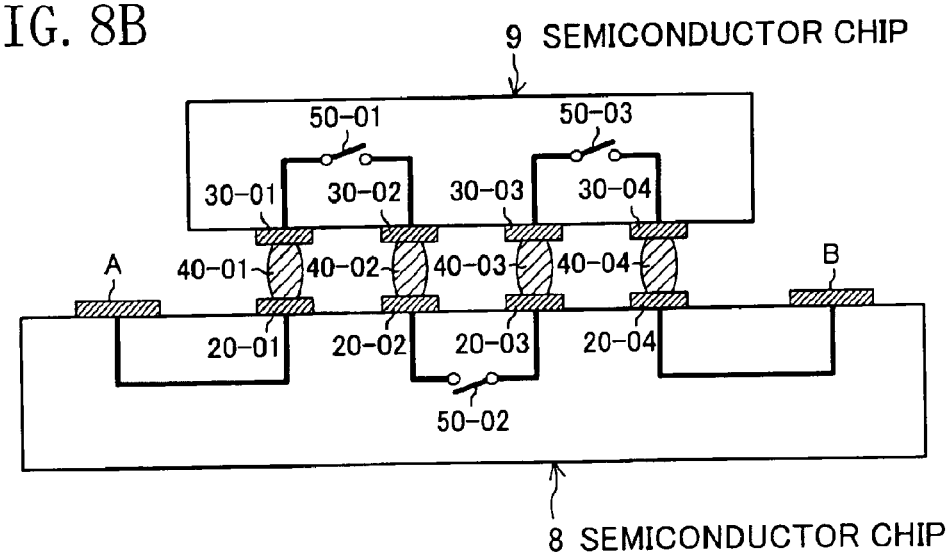
FIG. 8B is a cross-sectional view of the chip-on-chip multi-chip type module of the sixth embodiment.

FIG. 8A is a schematic top view of the COC type multi-chip module, and FIG. 8B is a cross-sectional view of the COC type multi-chip module taken along the line b—b in FIG. 8A. The reference character 8 denotes a master semiconductor chip, and the reference character 9 denotes a slave semiconductor chip located above the master semiconductor chip 8. Although the master and slave semiconductor chips 8 and 9 are each provided at its inner portion with an internal circuit like the master and slave semiconductor chips 1 and 2 shown in FIG. 1, the internal circuits are not shown for the sake of simplicity.

In FIG. 8B, on the master semiconductor chip 8, a connection pad 20-01 connected to the inner circuit associated thereto is provided, and on the slave semiconductor chip 9, a connection pad 30-01 connected to the inner circuit associated thereto is provided. Both the connection pads 20-01 and 30-01 are electrically connected to each other via a conductive connecting member 40-01 and thus allows the electrical connection between the inner circuit in the master semiconductor chip 8 and the inner circuit in the slave semiconductor chip 9. The master semiconductor chip 8 is further provided with connection pads 20-02, 20-03 and 20-04, and the slave semiconductor chip 9 is further provided with connection pads 30-02, 30-03 and 30-04. The connection pads on the master semiconductor chip 8 and the corresponding connection pads on the slave semiconductor chip 9 are electrically connected in the same manner as the connection pads 20-01 and 30-01. That is, the connection pads 20-02, 20-03 and 20-04 are electrically connected to the connection pads 30-02, 30-03 and 30-04 via conductive connecting members 40-02, 40-03 and 40-04, respectively.

The multi-chip module of the present embodiment is further provided with the following test components. Specifically, the slave semiconductor chip 9 is further provided with: a switch element 50-01 for making a connection between the two connection pads 30-01 and 30-02 electrically insulated from each other; and a switch element 50-03 for making a connection between the two connection pads 30-03 and 30-04 electrically insulated from each other.

On the other hand, in FIG. 5B, the master semiconductor chip 8 is further provided with: a switch element 50-02 for making a connection between the two connection pads 20-02 and 20-03 electrically insulated from each other and located on the center portion of the master semiconductor chip 8; and a pair of probing pads A and B. As also shown in FIG. 8B, the probing pad A is located at the left end of the semiconductor chip 8 and is connected to the connection pad 20-01, and the probing pad B is located at the right end of the semiconductor chip 8 and is connected to the connection pad 20-04.

As shown in FIG. 8A, the master semiconductor chip 8 further includes probing pads C, D, E, F, G and H. The probing pads C, E and G are located at the left end of the semiconductor chip 8, and the probing pads D, F and H are located at the right end of the semiconductor chip 8, thus making three pairs of probing pads (C and D), (E and F) and (G and H) like the pair of probing pads A and B. The configuration of the master and slave semiconductor chips 8 and 9 between each pair of the probing pads (C and D), (E and F) and (G and H) is the same as that between the pair of probing pads A and B. More specifically, in the slave semiconductor chip 9, two switch elements 50-4 and 50-6 are provided between the probing pads C and D, two switch elements 50-7 and 50-9 are provided between the probing pads E and F, and two switch elements 50-10 and 50-12 are provided between the probing pads G and H. On the other hand, in the master semiconductor chip 8, a switch element 50-5 is provided between the probing pads C and D, a switch element 50-8 is provided between the probing pads E and F, and a switch element 50-11 is provided between the probing pads G and H. It should be noted that although not shown, the master semiconductor chip 8 is further provided with a probing pad for the on/off control of the twelve switch elements 50-01 through 50-12 provided in the master and slave semiconductor chips 8 and 9.

In addition, the multi-chip module shown in FIG. 8 is further provided with a test control circuit 80 including a conducting means 60. The conducting means 60 includes the twelve switch elements 50-01 through 50-12 provided in the master and slave semiconductor chips 8 and 9. The test control circuit 80 can form connection test lines as follows. Nodes of the four connecting members 40-01 through 40-04 are electrically conducted in a serial manner by using the three switch elements 50-01 through 50-03 between the probing pads A and B, thus forming a connection test line (AB). Similarly, a connection test line (CD) is formed using the three switch elements 50-04 through 50-06 between the probing pads C and D, a connection test line (EF) is formed using the three switch elements 50-07 through 50-09 between the probing pads E and F, and a connection test line (GH) is formed using the three switch elements 50-10 through 50-12 between the probing pads G and H.

Next, an interchip connection test method for the multi-chip module of the present embodiment will be described below.

Figure 9:
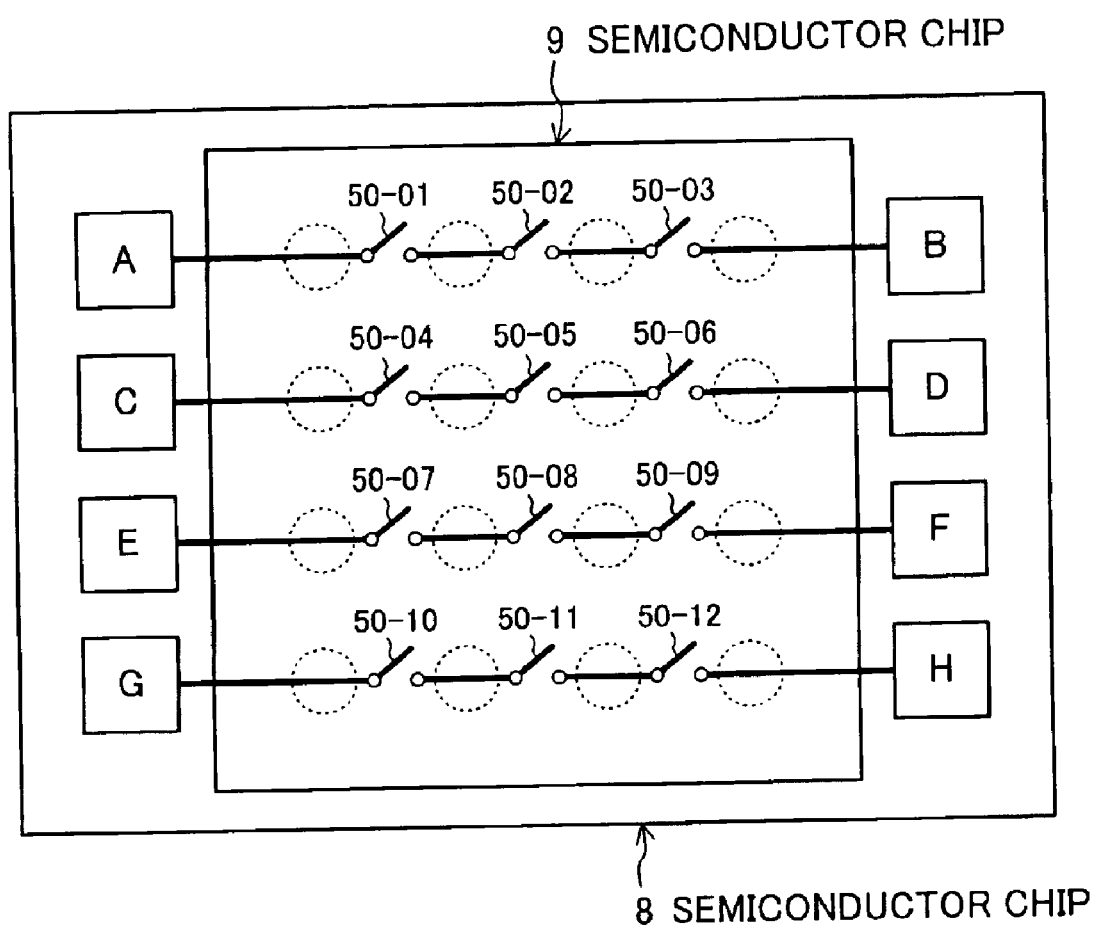
FIG. 9 is a diagram showing the state of each switch element during the normal operation of the multi-chip module of the sixth embodiment.

First, as shown in FIG. 9, all the switch elements 50-01 through 50-12 are controlled to turn off during the normal operation of the multi-chip module, thus electrically insulating the connection pads that should be originally electrically insulated from each other.

Figure 10:
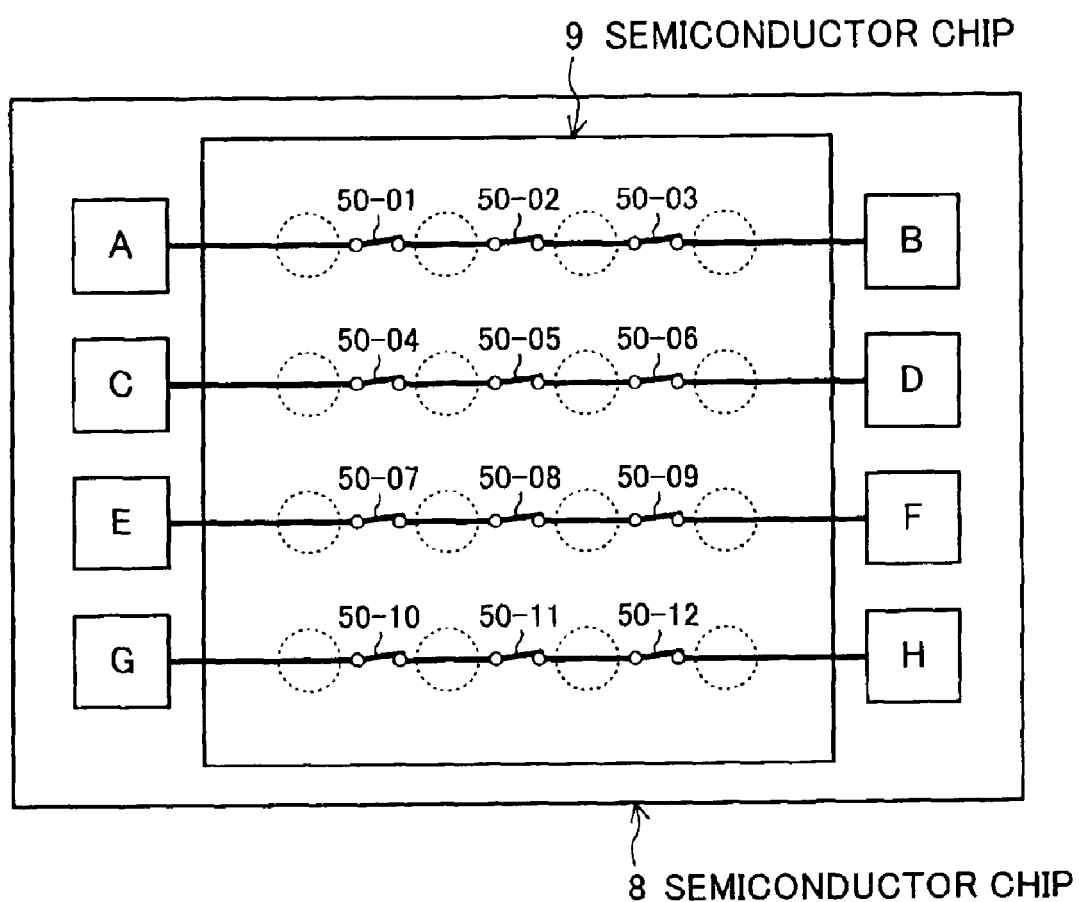
FIG. 10 is a diagram showing the state of each switch element during an interchip connection test for the multi-chip module of the sixth embodiment.
Figure 11:
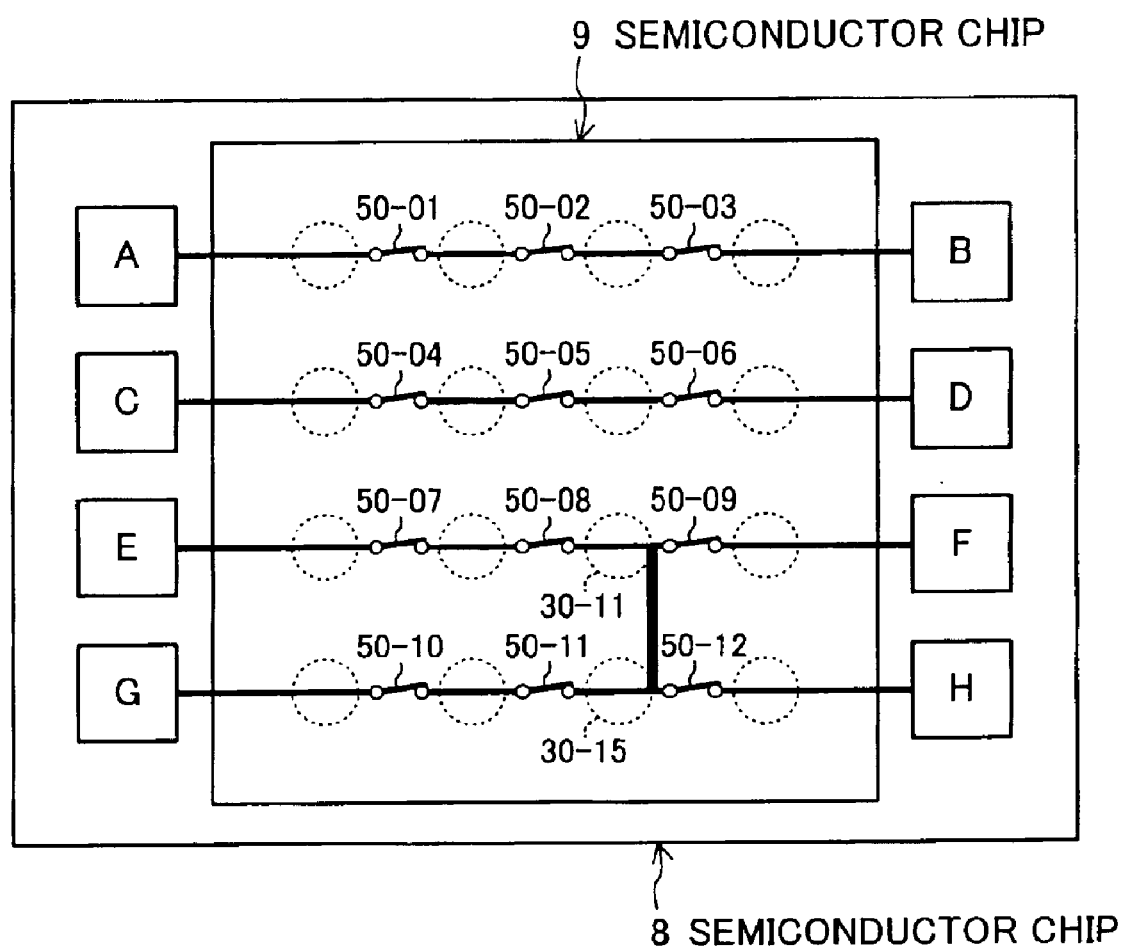
FIG. 11 is a diagram showing an example in which a short failure can be detected by the interchip connection test for the multi-chip module of the sixth embodiment.
Figure 22A:
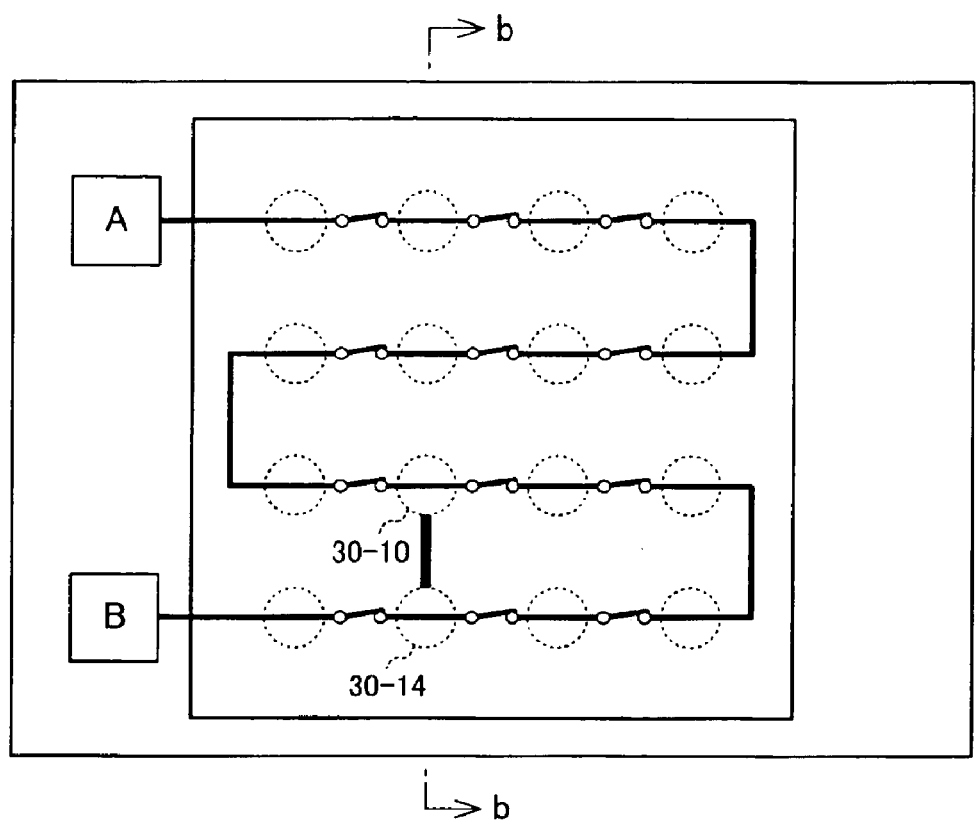
FIG. 22A is a diagram showing an example in which a short failure cannot be detected during the interchip connection test for the multi-chip module of the first embodiment.
Figure 22B:
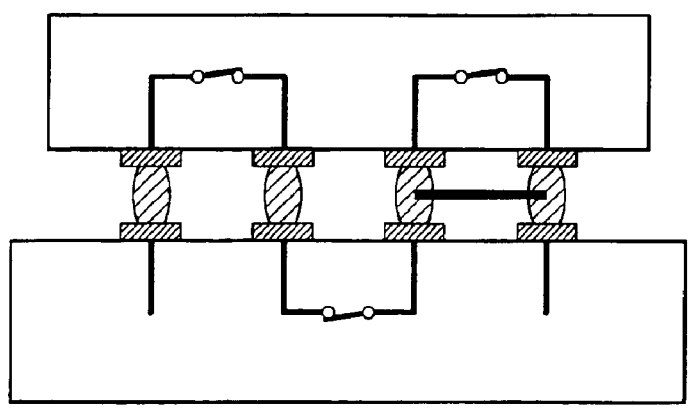
FIG. 22B is a cross-sectional view of the multi-chip module.

On the other hand, during the interchip connection test, all the switch elements 50-01 through 50-12 are controlled to turn on, thus forming the four connection test lines (AB), (CD), (EF) and (GH) as shown in FIG. 10. In this state, first, a test for determining conduction (which will be hereinafter called a conduction test) is carried out for each of the connection test lines (AB) through (GH). Next, a test for determining non-conduction (which will be hereinafter called a non-conduction test) is carried out to determine the non-conduction between each of the connection test lines (AB) through (GH) and the connection test line adjacent thereto. Since the conduction test is carried out for each connection test line in this manner, it is possible to determine the quality of all the interchip connection made by connecting the corresponding connection pads via the connecting members between the master and slave semiconductor chips 8 and 9. On the other hand, if a short failure occurs between the connection pad 30-11 and the connection pad 30-15 vertically adjacent to the connection pad 30-11, the two connection test lines (EF) and (GH) are brought into conduction during the non-conduction test for the connection test lines as shown in FIG. 11. Therefore, this short failure can be easily determined or detected by the non-conduction test. It is to be noted that a short failure occurred between the two connection pads 30-10 and 30-14, which is similar to that shown in FIG. 11, cannot be detected in the first embodiment because all nodes of the connecting members are connected in a serial manner in the first embodiment as shown in FIGS. 22A and 22B. In the present embodiment, however, such a short failure can be detected as described above. Therefore, the present embodiment is superior to the first embodiment in this regard.

(Seventh Embodiment)

Hereinafter, a seventh embodiment of the present invention will be described. In the present embodiment, a modification is made to the interchip connection test of the sixth embodiment.

Figure 12:
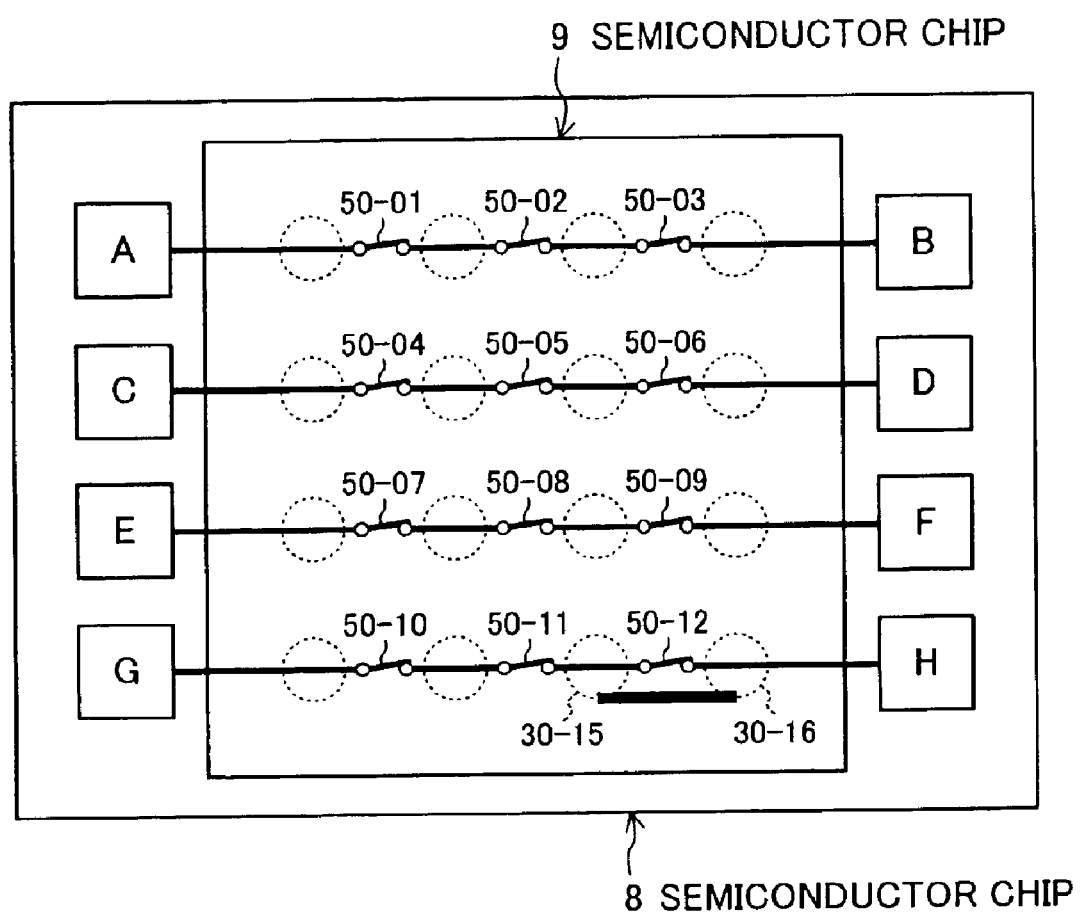
FIG. 12 is a diagram showing an example in which a short failure cannot be detected by the interchip connection test of the multi-chip module of the sixth embodiment.

In the sixth embodiment, even if a short failure occurs between the connection pad 30-15 and the connection pad 30-16 adjacent thereto in the horizontal direction in FIG. 12 (i.e., in the direction in which the connection test lines extend), for example, this short failure cannot be detected because the switch element 50-12 located between both the connection pads is in on state. As a result, the multi-chip module is erroneously determined to be non-defective. Therefore, in the present embodiment, the interchip connection test of the sixth embodiment is modified to solve this problem.

Figure 13A:
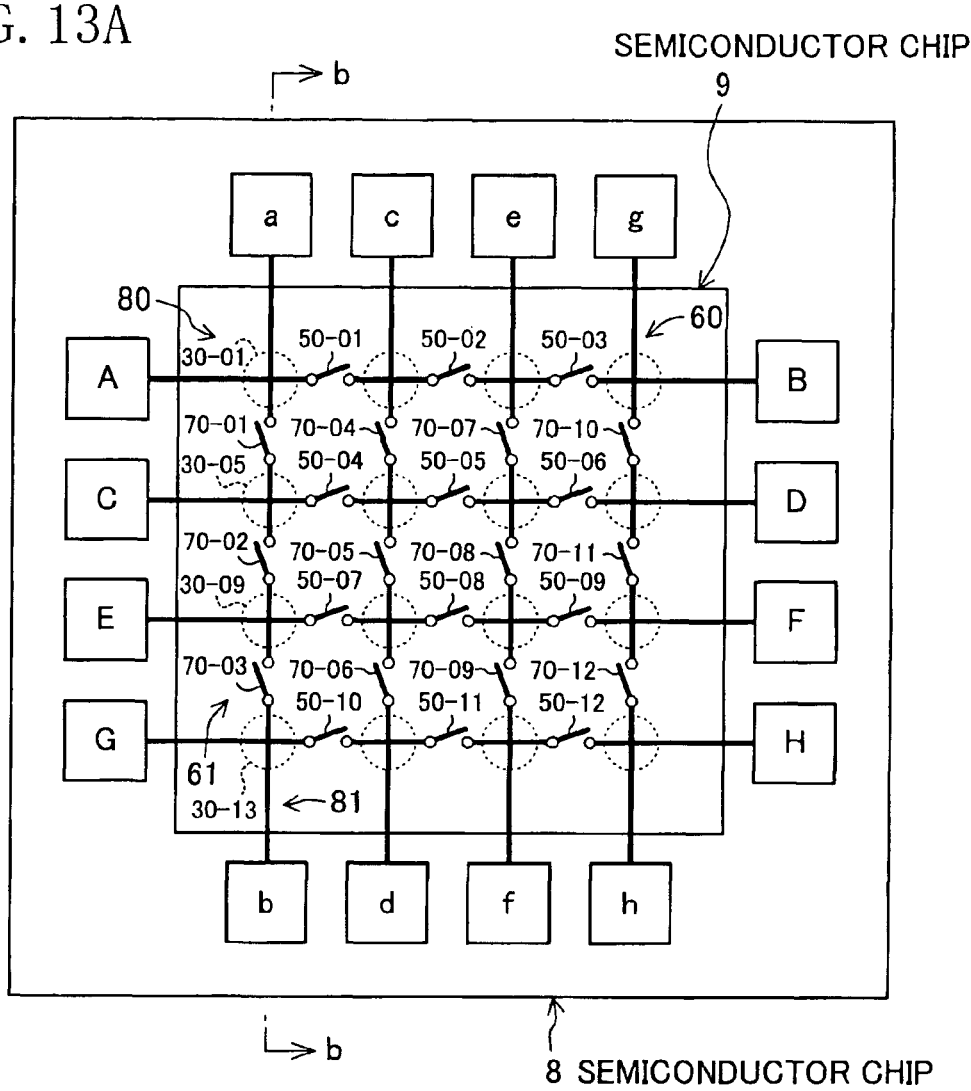
FIG. 13A is a schematic top view showing a circuit configuration of a chip-on-chip type multi-chip module according to a seventh embodiment of the present invention.
Figure 13B:
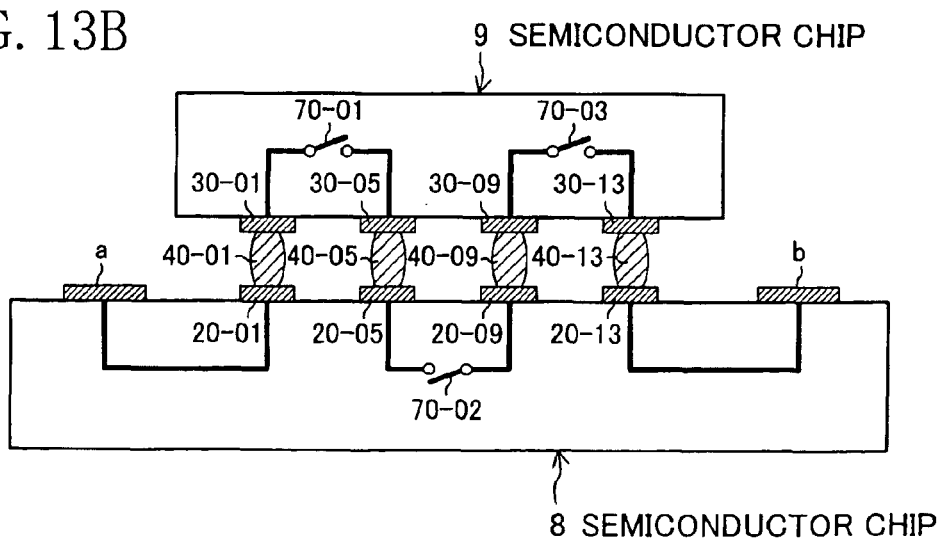
FIG. 13B is a cross-sectional view of the chip-on-chip type multi-chip module of the seventh embodiment.

FIG. 13 shows the overall configuration of the multi-chip module of the present embodiment. FIG. 13A is a schematic top view of the multi-chip module, and FIG. 13B is a cross-sectional view of the multi-chip module taken along the line b—b in FIG. 13A. In FIGS. 13A and 13B, in addition to the configuration shown in FIG. 8, a plurality of switch elements and a plurality of pairs of probing pads are added in the vertical direction.

Hereinafter, the vertical configuration will be described in detail, although a description about the configuration similar to that shown in FIG. 8, in which the horizontal connection test lines (AB), (CD), (EF) and (GH) are formed, will be omitted.

In the multi-chip module shown in FIGS. 13A and 13B, a large number of connection pads 20-01 through 20-16, and 30-01 through 30-16 are horizontally and vertically aligned to form a lattice-like configuration. In connection with this, eight probing pads a through h are provided at vertical ends of the semiconductor chip 8. As shown in FIG. 13B, between the pair of probing pads a and b, a slave semiconductor chip 9 is provided with: a switch element 70-01 for making a connection between the two connection pads 30-01 and 30-05 which are vertically aligned in FIG. 13A; and a switch element 70-03 for making a connection between the two connection pads 30-09 and 30-13 which are also vertically aligned in FIG. 13A. On the other hand, a master semiconductor chip 8 is provided with: a switch element 70-02 for making a connection between the two connection pads 20-05 and 20-09 which are vertically aligned in FIG. 13A; and the pair of probing pads a and b.

Similarly, between the other three pairs of vertically corresponding probing pads (c and d, e and f, and g and h), the slave semiconductor chip 9 is further provided with switch elements 70-04, 70-06, 70-07, 70-09, 70-10 and 70-12, and the master semiconductor chip 8 is further provided with switch elements 70-05, 70-08 and 70-11, as shown in FIG. 13A. More specifically, between the probing pads c and d, the slave semiconductor chip 9 is provided with the two switch elements 70-04 and 70-06 and the master semiconductor chip 8 is provided with the switch element 70-05. Between the probing pads e and f, the slave semiconductor chip 9 is provided with the two switch elements 70-07 and 70-09 and the master semiconductor chip 8 is provided with the switch element 70-08. And between the probing pads g and h, the slave semiconductor chip 9 is provided with the two switch elements 70-10 and 70-12 and the master semiconductor chip 8 is provided with the switch element 70-11. Furthermore, the master semiconductor chip 8 is provided with a probing pad (not shown) for turning the twelve vertically aligned switch elements 70-01 through 70-12 on/off.

In addition, the multi-chip module shown in FIG. 13 includes: a conducting means 60 made up of the twelve switch elements 50-01 through 50-12 horizontally aligned in FIG. 13A; and a conducting means 61 made up of the twelve switch elements 70-01 through 70-12 vertically aligned in FIG. 13A. The multi-chip module further includes a test control circuit 81. In the test control circuit 81, horizontal connection test lines (AB), (CD), (EF) and (GH) can be formed between four pairs of the horizontally corresponding probing pads A and B, C and D, E and F, and G and H, respectively, as already described with reference to FIG. 8. Also, in the test control circuit 81, a vertical connection test line (ab) can be formed between the pair of probing pads a and b by bringing four connecting members 40-01, 40-05, 40-09 and 40-13 (which are vertically aligned in FIG. 13A) into conduction in a serial manner using the three switch elements 70-01 through 70-03. Similarly, in the test control circuit 81, vertical connection test lines (cd), (ef) and (gh) can be formed between the remaining three pairs of probing pads c and d, e and f, and g and h, respectively. This test control circuit 81 has the function of changing the combination of nodes of the four connecting members, which will form a connection test line as described above, to allow selection between forming horizontal connection test lines and forming vertical connection test lines.

Figure 14:
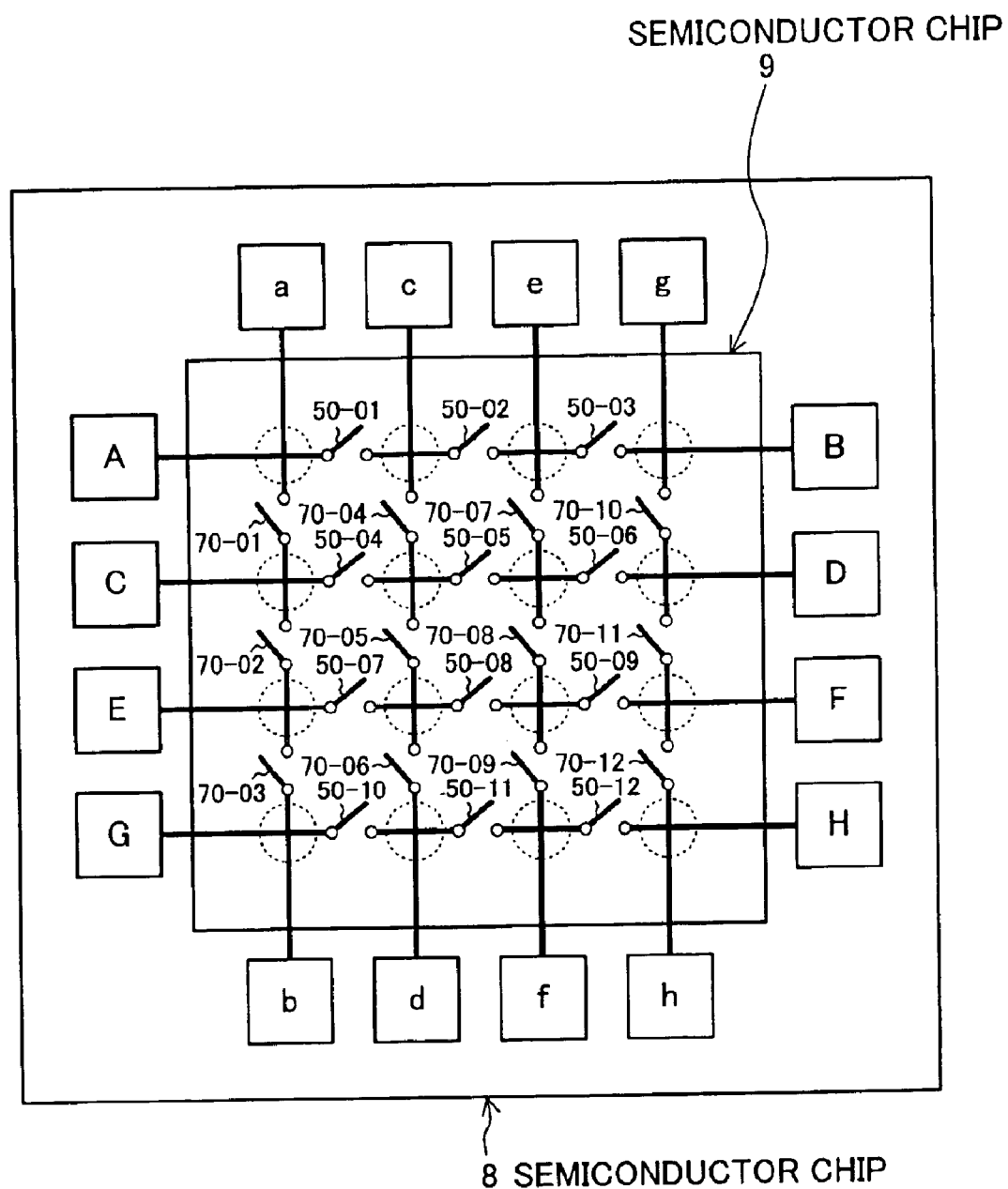
FIG. 14 is a diagram showing the state of each switch element during the normal operation of the multi-chip module of the seventh embodiment.

Accordingly, in the present embodiment, all the switch elements 50-01 through 50-12 and 70-01 through 70-12 are first controlled to turn off during the normal operation as shown in FIG. 14, thus electrically insulating the connection pads that should be originally electrically insulated from each other.

Meanwhile, during the interchip connection test, a connection test for the horizontal connection test lines (AB), (CD), (EF) and (GH) and a connection test for the vertical connection test lines (ab), (cd), (ef) and (gh) are carried out. Hereinafter, the case where the connection test for the horizontal connection test lines is carried out first will be described by way of example.

Figure 15:
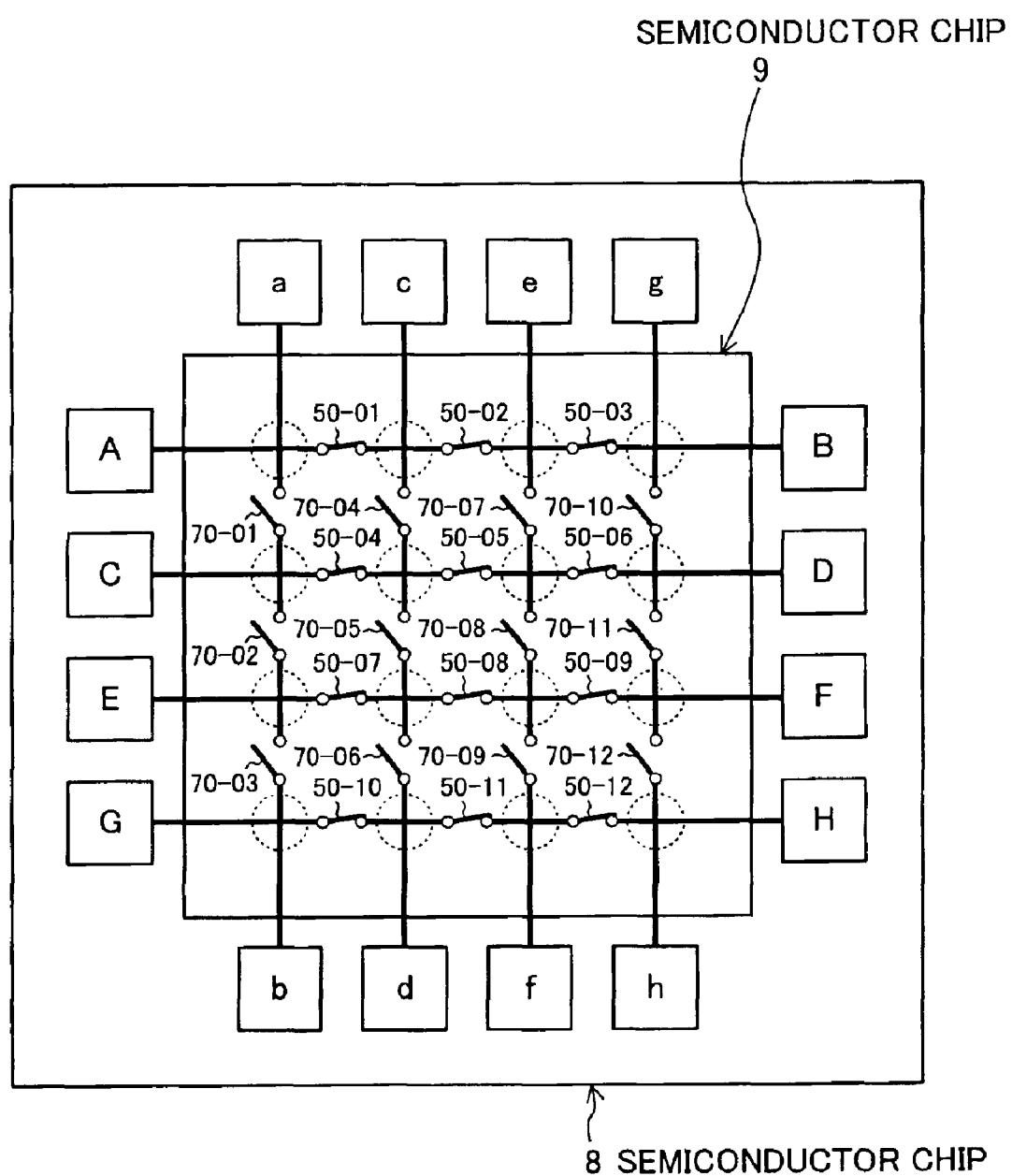
FIG. 15 is a diagram showing horizontal connection test lines during an interchip connection test for the multi-chip module of the seventh embodiment.
Figure 17:
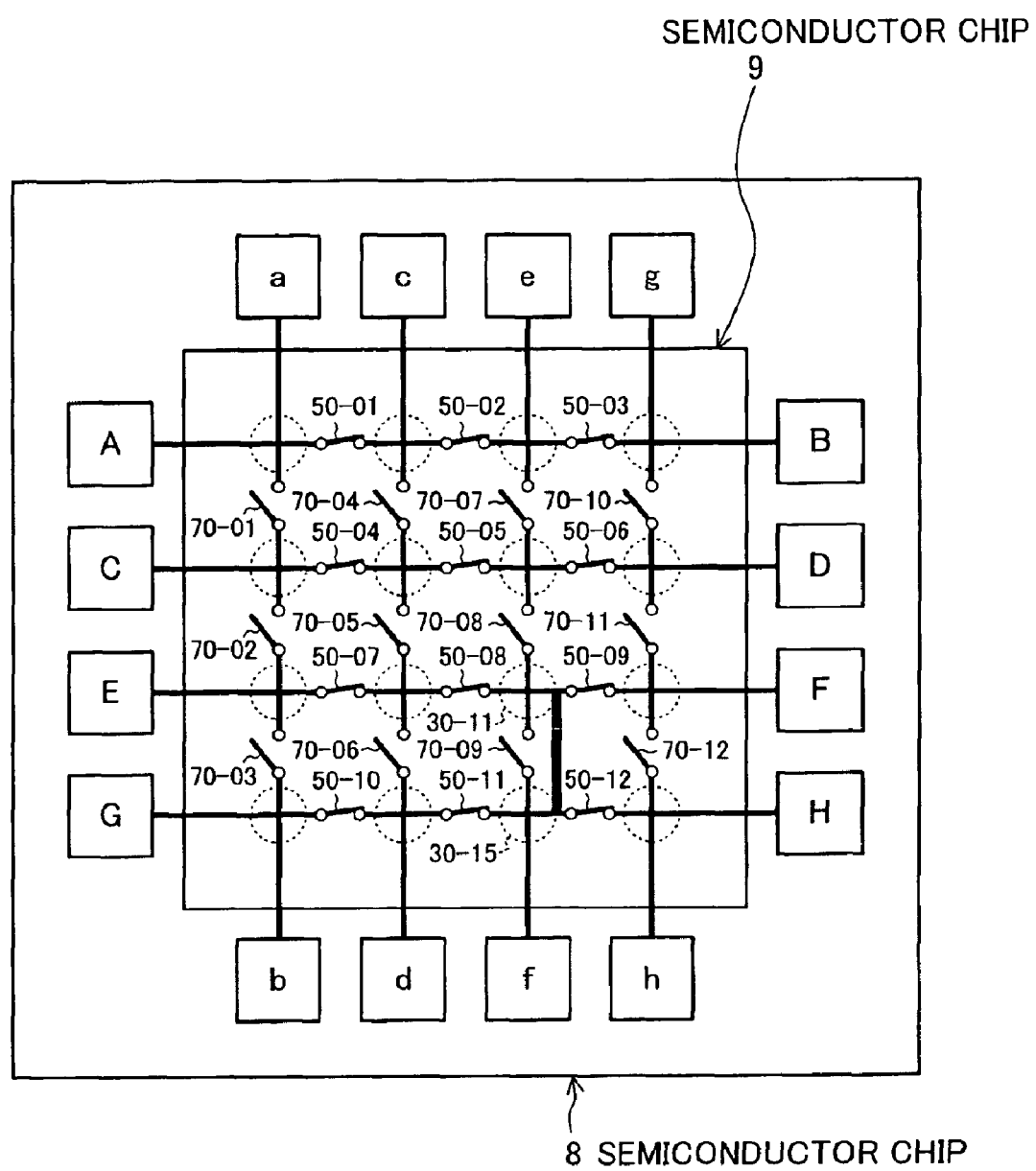
FIG. 17 is a diagram showing an example in which a short failure can be detected by the interchip connection test for the multi-chip module when the horizontal connection test lines are formed.

As shown in FIG. 15, all the horizontally aligned switch elements 50-01 through 50-12 are controlled to turn on while all the vertically aligned switch elements 70-01 through 70-12 are controlled to turn off, thus forming four horizontal connection test lines (AB), (CD), (EF) and (GH). Then, the conduction test is carried out for each horizontal connection test line, and the non-conduction test is carried out for the horizontal connection test lines located adjacent to each other. Thus, it is possible to determine the quality of the interchip connection made by the horizontally aligned connecting members. Furthermore, if a short failure occurs between the two vertically aligned connection pads 30-11 and 30-15 as shown in FIG. 17, for example, this short failure can be determined or detected because the two horizontal connection test lines (EF) and (GH) are brought into conduction during the non-conduction test.

Figure 16:
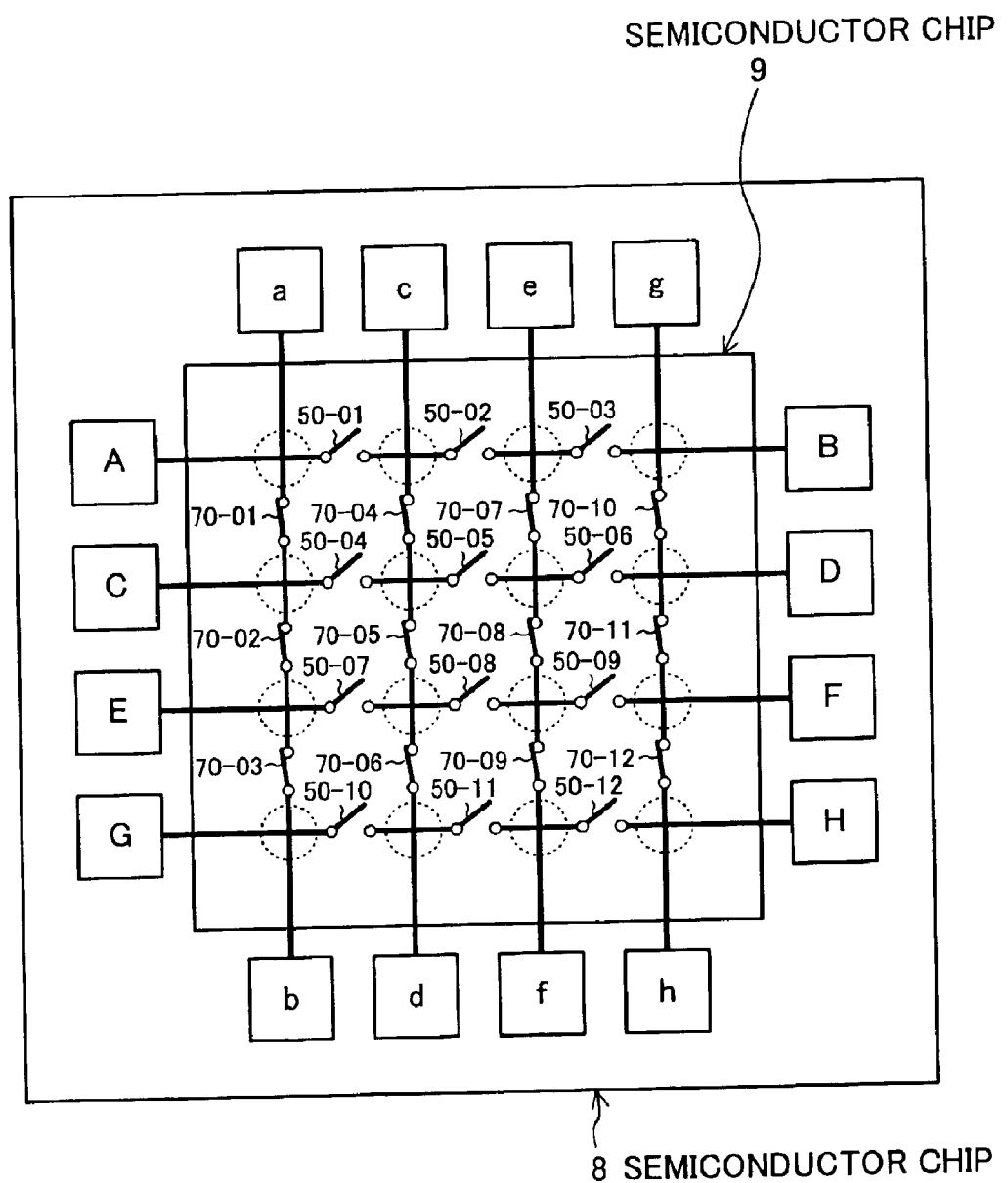
FIG. 16 is a diagram showing vertical connection test lines during the interchip connection test for the multi-chip module of the seventh embodiment.
Figure 18:
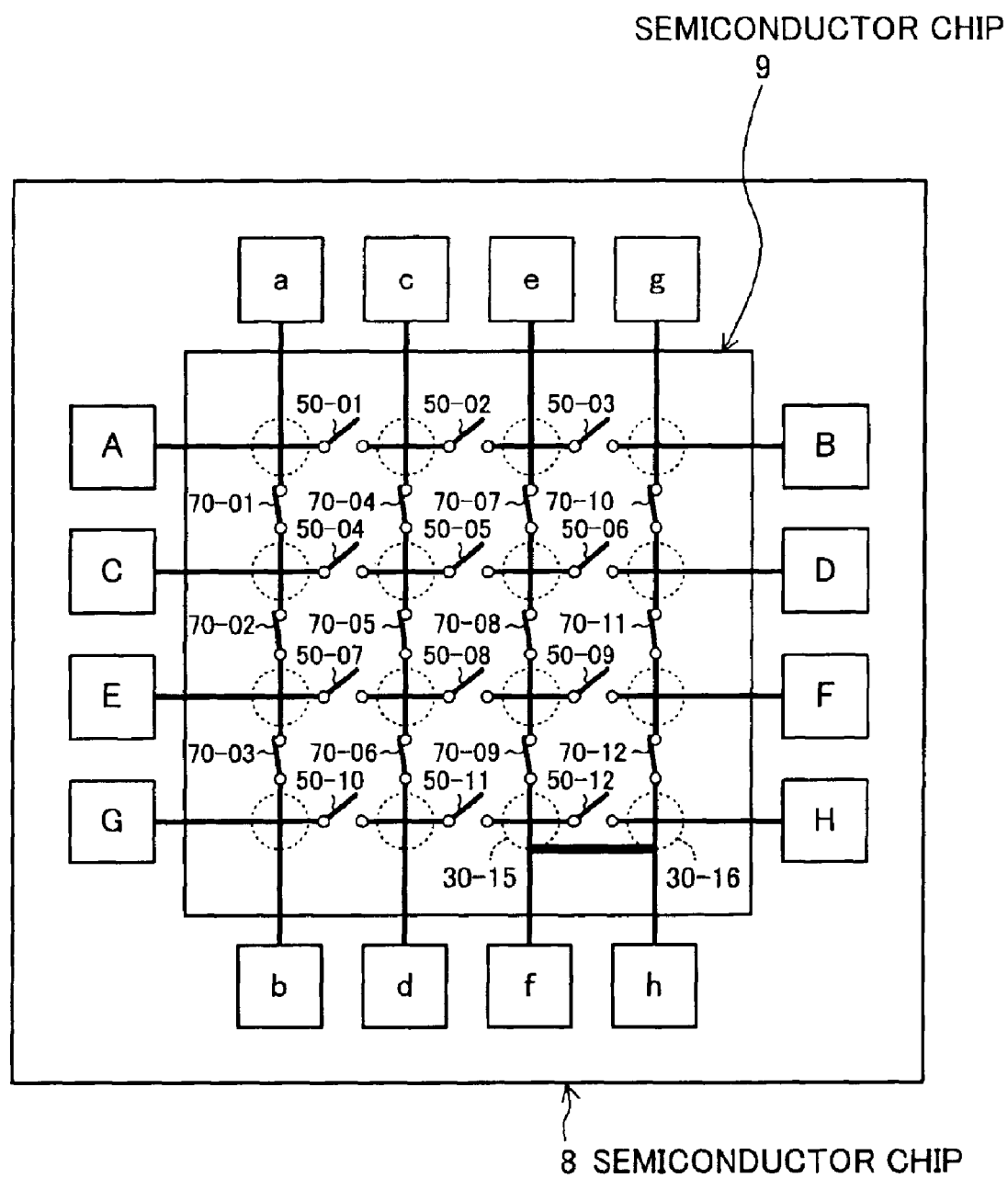
FIG. 18 is a diagram showing an example in which a short failure can be detected by the interchip connection test for the multi-chip module when the vertical connection test lines are formed.

Next, as shown in FIG. 16, all the vertically aligned switch elements 70-01 through 70-12 are controlled to turn on while all the horizontally aligned switch elements 50-01 through 50-12 are controlled to turn off, thus forming four vertical connection test lines (ab), (cd), (ef) and (gh). Then, the conduction test is carried out for each vertical connection test line, and the non-conduction test is carried out for the vertical connection test lines located adjacent to each other. Thus, it is possible to determine the quality of the interchip connection made by the vertically aligned connecting members. Furthermore, if a short failure occurs between the two horizontally aligned connection pads 30-15 and 30-16 as shown in FIG. 18, for example, this short failure can be determined or detected because the two vertical connection test lines (ef) and (gh) are brought into conduction during the non-conduction test in the present embodiment, although this short failure cannot be determined or detected in the sixth embodiment as already described above.

In the present embodiment, a large number of connection pads are aligned to form a lattice-like configuration, and selection is allowed between forming a plurality of horizontal connection test lines and forming a plurality of vertical connection test lines. Thus, the test control circuit 81 can be easily designed, and the effect of reducing the area of the test control circuit 81 can be achieved.

It should be noted that although nodes of four horizontally or vertically aligned connecting members are electrically connected in a serial manner to form a connection test line in the sixth and seventh embodiments, at least two connecting members may be used to form a connection test line. The bottom line is that a single connection test line includes a single switch element.

(Eighth Embodiment)

Hereinafter, an eighth embodiment according to the present invention will be described. In the present embodiment, a modification is made to the configuration for suppressing crosstalk between the signal lines of the semiconductor chips which is described in the fourth embodiment.

In the fourth embodiment illustrated in FIG. 4, specific two connection pads 2-21 and 2-23, for example, can be electrically connected in a serial manner via the switch elements (MOS switches) 1-31 and 2-31 to allow the interchip connection test. In that case, due to a parasitic capacitance generated between the gate and source of each of the off-state switch elements 1-31 and 2-31, there arises the problem of crosstalk between the signal lines connected to the two connection pads 2-21 and 2-23. To cope with this, the connection pad 2-22, located between the connection pads 2-21 and 2-23 and not used in signal transmission, is grounded during the normal operation of the module. Therefore, such connection pads that are not used in the signal transmission have to be provided in the fourth embodiment. However, in the present embodiment, the need for the connection pads that are not used in signal transmission is eliminated.

Figure 19:
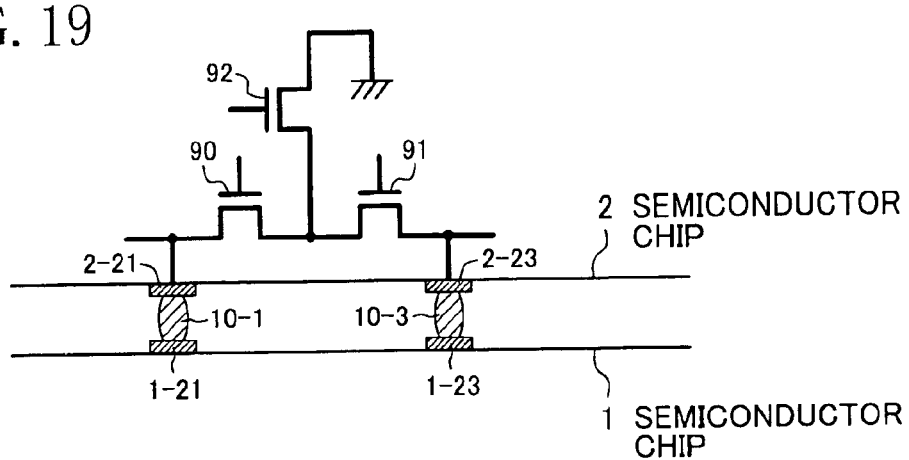
FIG. 19 is a diagram showing the principal part of the circuit configuration of a chip-on-chip type multi-chip module according to an eighth embodiment of the present invention.

FIG. 19 shows the principal part of the multi-chip module of the present embodiment. In FIG. 19, first and second switch circuits 90 and 91 for making a connection between two connection pads 2-21 and 2-23 are provided between the connection pads 2-21 and 2-23, and a node between both the switch circuits 90 and 91 is grounded via a third switch circuit 92.

Figure 20A:
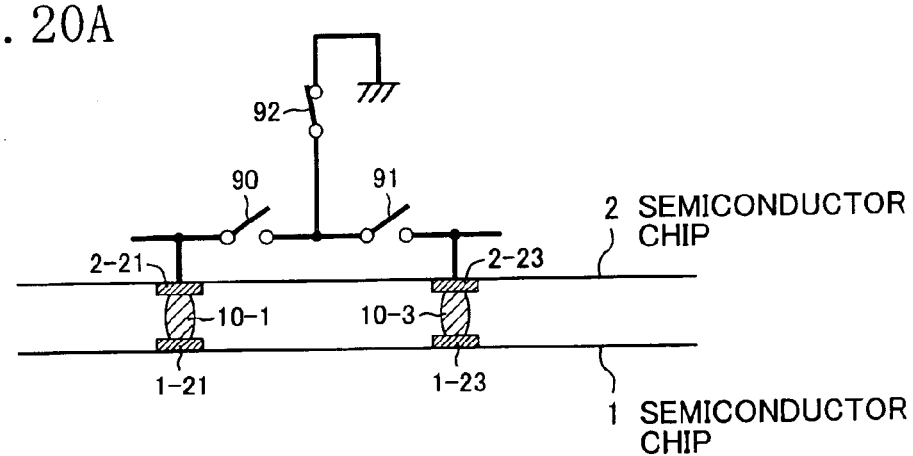
FIG. 20A is a diagram showing the states of first through three switch circuits during the normal operation of the multi-chip module.
Figure 20B:
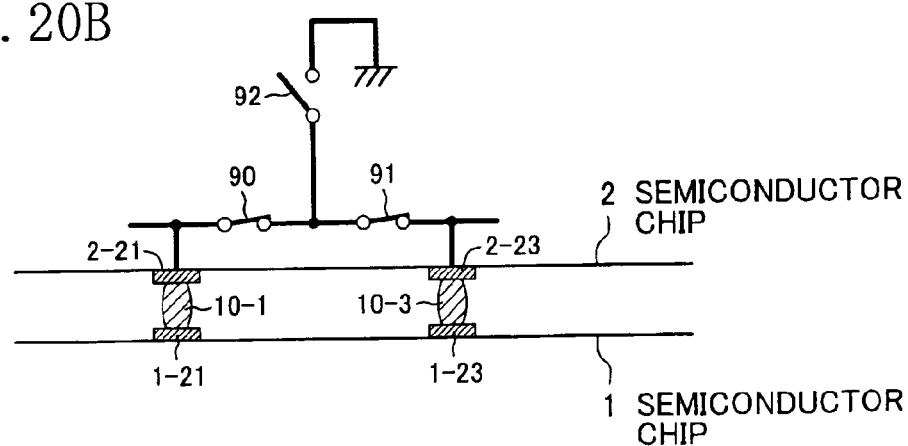
FIG. 20B is a diagram showing the states of the first through three switch circuits during an interchip connection test for the multi-chip module.

As shown in FIG. 20B, during the interchip connection test, the first and second switch circuits 90 and 91 are controlled to turn on, and the third switch circuit 92 is controlled to turn off, thus electrically connecting the two connection pads 2-21 and 2-23 in a serial manner in the present embodiment. During the normal operation, as shown in FIG. 20A, the first and second switch circuits 90 and 91 are controlled to turn off, and the third switch circuit 92 is controlled to turn on. Thus, the node between the two connection pads 2-21 and 2-23 is grounded and becomes a low-impedance node to solve the problem of the crosstalk.

Unlike the fourth embodiment, the present embodiment can eliminate the need for the connection pad that is located between the two connection pads 2-21 and 2-23 and is not used in signal transmission. The number of switch circuits provided for two connection pads is three in the present embodiment and is larger by one than that of switch circuits provided for two connection pads in the fourth embodiment since only two switch circuits are required for two connection pads in the fourth embodiment. However, this causes no problem in the present embodiment because the size of the switch element is originally small. In the present embodiment, if the area of the semiconductor chip is determined by the total size of connection pads provided thereon, the effect of reducing the chip area is outstandingly achieved since the number of connection pads is reduced.

(Ninth Embodiment)

Hereinafter, a ninth embodiment of the present embodiment will be described.

Figure 21:
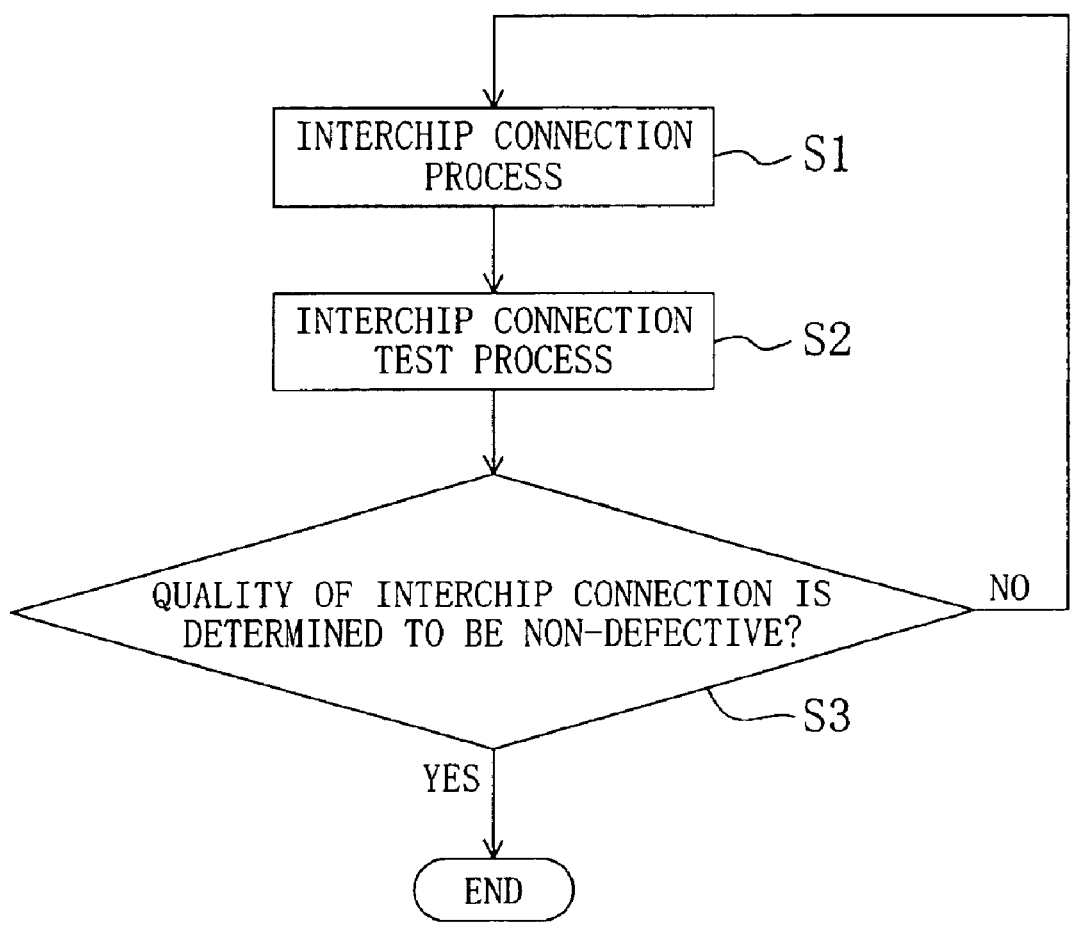
FIG. 21 is a flow chart of a ninth embodiment of the present invention.

FIG. 21 is a flow chart of a manufacturing process and an interchip connection test process for a multi-chip module according to the present embodiment. As shown in FIG. 21, first, the interchip connection process is carried out in step S1 to connect the corresponding connection pads between master and slave semiconductor chips by using conductive connecting members. Thereafter, in step S2, the interchip connection test method of any one of the forgoing embodiments is carried out. In step S3, the quality of the interchip connection is determined based on the result of the interchip connection test. If the module is determined to be non-defective one having good interchip connection, the process comes to an end. If the module, however, is determined to be defective, then the process goes back to step S1. In step S1, the connecting members are removed, and the semiconductor chips are cleaned and then subjected to the interchip connection process in which the corresponding connection pads are connected between the same master and slave semiconductor chips again by using new conductive connecting members.

Accordingly, in the present embodiment, the effect of making most of the manufactured multi-chip modules non-defective can be attained.

Although the description has been made about the chip-on-chip (COC) type multi-chip module, the present invention is not limited to the COC type multi-chip module but includes a multi-chip module formed by wire bonding. It is to be noted that a simple inspection such as a visual inspection can be performed for the wire bonding since the wiring is visible over the upper face of each semiconductor chip. Accordingly, in the present invention, if the multi-chip module includes a semiconductor chip of the type connected to another semiconductor chip so as to be placed over or under said another semiconductor chip, and semiconductor chips of the type connected to each other by wire bonding, the effects equivalent to those obtained by the COC type multi-chip module only can be attained.

What is claimed is:

1. A multi-chip module that comprises a plurality of semiconductor chips each having a plurality of connection pads and that is implemented by connecting, via a plurality of conductive connecting members located between the associated connection pads, the associated connection pads to each other between the semiconductor chips, wherein at least one of the plurality of semiconductor chips comprises a test control circuit having conducting means for bringing said connecting members into electrical conduction in a serial manner, said connecting members are electrically insulated from each other in the multi-chip module when the conducting means does not work.

2. The multi-chip module according to claim 1, wherein two of the plurality of semiconductor chips, the associated connection pads of which are connected to each other via the connecting members located between the associated connection pads, are each provided with a test control circuit, and wherein the test control circuits each have conducting means for bringing into electrical conduction in a serial manner nodes of the plurality of connecting members located between the two semiconductor chips and electrically insulated from each other.

3. The multi-chip module according to claim 1, wherein the number of the semiconductor chips is two, wherein one of the two semiconductor chips as a first semiconductor chip has a plurality of connection pad groups each including a primary connection pad and a secondary connection pad that is electrically the same node as the primary connection pad, wherein the other semiconductor chip as a second semiconductor chip has a plurality of connection pads that are connected to the primary and secondary connection pads of the first semiconductor chip via a plurality of conductive connecting members, which are located between the associated connection pads, respectively, wherein the second semiconductor chip includes the test control circuit, and wherein the test control circuit has conducting means for bringing into electrical conduction in a serial manner nodes of the plurality of connecting members located between the first and second semiconductor chips and electrically insulated from each other.

4. The multi-chip module according to claim 1, 2 or 3, wherein the test control circuit comprises a plurality of switch elements, wherein the plurality of switch elements each have one end thereof connected to a node of the connecting member preselected from the plurality of connecting members located between the connection pads, and have the other end thereof connected to a node of the other connecting member electrically insulated from the preselected connecting member, and wherein when the plurality of switch elements are all in on state, nodes of the plurality of connecting members having been electrically insulated from each other are electrically conducted in a serial manner.

5. The multi-chip module according to claim 1, 2 or 3, further comprising connecting means for connecting a node of at least one of the plurality of connecting members, which is located between the connection pads and not used in signal transmission between the two semiconductor chips, to a power supply terminal or an earth terminal provided in the multi-chip module.

6. A semiconductor chip that comprises a plurality of connection pads and is used to implement a multi-chip module by connecting, via a plurality of conductive connecting members located between the associated connection pads, the associated connection pads between the semiconductor chip and another semiconductor chip, wherein the semiconductor chip is provided with a test control circuit having conducting means for bringing into electrical conduction in a serial manner nodes of the plurality of connecting members electrically insulated from each other in the multi-chip module that has been implemented.

7. An interchip connection test method for a multi-chip module that comprises a plurality of semiconductor chips each having a plurality of connection pads and that is implemented by connecting, via a plurality of conductive connecting members, the associated connection pads to each other between the semiconductor chips, the method comprising the steps of:

during the interchip connection test, bringing into electrical conduction in a serial manner nodes of the plurality of connecting members electrically insulated from each other in the multi-chip module; and measuring the impedance between both ends of a circuit including the connecting members that have been electrically conducted in a serial manner, thus determining the quality of the connection between the semiconductor chips.

8. A multi-chip module that comprises a plurality of semiconductor chips each having a plurality of connection pads and that is implemented by connecting, via a plurality of conductive connecting members located between the associated connection pads, the associated connection pads between the semiconductor chips, wherein the multi-chip module further comprises a test control circuit having conducting means for forming a plurality of connection test lines by bringing into electrical conduction in a serial manner at least every two nodes of the plurality of connecting members electrically insulated from each other.

9. The multi-chip module according to claim 8, wherein the test control circuit has the function of changing the combination of nodes of at least two of the connecting members to the connection test lines to be formed.

10. The multi-chip module according to claim 9, wherein the plurality of connection pads on the semiconductor chips are provided to form a lattice-like configuration, and wherein the test control circuit changes the combination of nodes of the connecting members located between the connection pads to form a plurality of vertical connection test lines or a plurality of horizontal connection test lines.

11. An interchip connection test method for the multi-chip module of claim 8, 9 or 10, the method comprising the steps of:

during the interchip connection test, forming a plurality of connection test lines using the conducting means;

carrying out a conduction test for each of the connection test lines; and carrying out a non-conduction test for the connection test lines located adjacent to each other, thus determining the quality of the connection between the semiconductor chips.

12. The interchip connection test method according to claim 11, wherein if the connection between the semiconductor chips is determined to be defective by carrying out the conduction test for each of the connection test lines and the non-conduction test for the connection test lines located adjacent to each other, the step of connecting, via conductive connecting members, the associated connection pads to each other between the same semiconductor chips is carried out again.

13. A multi-chip module that comprises a plurality of semiconductor chips each having a plurality of connection pads and that is implemented by connecting, via a plurality of conductive connecting members, the associated connection pads to each other between the semiconductor chips, wherein the multi-chip module further comprises:

first and second switch circuits that are located between predetermined two of the connecting members and are connected to each other in series; and a third switch circuit located between a node at which the first and second switch circuits are connected and the ground.

14. An interchip connection test for the multi-chip module of claim 13, comprising the steps of:

during the interchip connection test, turning the first and second switch circuits on and turning the third switch circuit off; and during the normal operation of the module, turning the first and second switch circuits off and turning the third switch circuit on.

* * * * *